(12) United States Patent
Toda

(10) Patent No.: US 8,687,406 B2
(45) Date of Patent: Apr. 1, 2014

(54) SEMICONDUCTOR MEMORY DEVICE AND METHOD OF CONTROLLING THE SAME

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 13/597,740

(22) Filed: Aug. 29, 2012

(65) Prior Publication Data

US 2013/0250652 A1    Sep. 26, 2013

(30) Foreign Application Priority Data

Mar. 26, 2012  (JP) ................. 2012-069572

(51) Int. Cl.
*G11C 11/00*  (2006.01)

(52) U.S. Cl.
USPC ............ 365/148; 365/100; 365/163; 365/113

(58) Field of Classification Search
USPC .................. 365/148, 100, 163, 113
See application file for complete search history.

(56) References Cited

U.S. PATENT DOCUMENTS

| | | | |
|---|---|---|---|
| 6,667,900 | B2 | 12/2003 | Lowrey et al. |
| 6,816,410 | B2 | 11/2004 | Kleveland et al. |
| 7,236,394 | B2 | 6/2007 | Chen et al. |
| 7,889,538 | B2 | 2/2011 | Toda |
| 7,989,789 | B2 | 8/2011 | Toda |
| 8,023,313 | B2 | 9/2011 | Toda |
| 2006/0126395 | A1 | 6/2006 | Chen et al. |
| 2010/0008125 | A1* | 1/2010 | Inaba ............................ 365/148 |
| 2010/0027308 | A1 | 2/2010 | Maejima |

FOREIGN PATENT DOCUMENTS

| | | |
|---|---|---|
| JP | 2005-11495 | 1/2005 |
| JP | 2005-514722 | 5/2005 |
| JP | 2005-522045 | 7/2005 |
| JP | 2010-20863 | 1/2010 |
| JP | 2010-33675 | 2/2010 |
| JP | 2010-55719 | 3/2010 |
| JP | 2012-203936 | 10/2012 |
| WO | WO 2012-128134 A1 | 9/2012 |

OTHER PUBLICATIONS

U.S. Appl. No. 13/962,471, filed Aug. 8, 2012, Toda.
U.S. Appl. No. 13/778,642, filed Feb. 27, 2013, Toda.

* cited by examiner

*Primary Examiner* — Jason Lappas
(74) *Attorney, Agent, or Firm* — Oblon, Spivak, McClelland, Maier & Neustadt, L.L.P.

(57) ABSTRACT

According to an embodiment, a semiconductor memory device comprises: a memory cell array configured having a plurality of memory cell mats, the memory cell mats including a plurality of first lines, second lines, and memory cells, and the memory cell mats being stacked such that the first and second lines are shared alternately by each of the memory cell mats; and a peripheral circuit. Each of the memory cells has a variable resistance characteristic and a current rectifying characteristic. An orientation from an anode toward a cathode of all the memory cells is identical. The peripheral circuit applies to one of the first line and the second line connected to an anode side of the selected memory cell a selected bit line voltage, and applies to the other a selected word line voltage.

20 Claims, 29 Drawing Sheets

FIG. 21

| Bus Fall & MUX | 2a : y Line Driver | Bus Fall & MUX | 2a : y Line Driver | Bus Fall & MUX |
|---|---|---|---|---|
| 3a : x Line Driver | 1 : Memory Cell Array | 3a : x Line Driver | 1 : Memory Cell Array | 3a : x Line Driver |
| Bus Fall & MUX | 2a : y Line Driver | Bus Fall & MUX | 2a : y Line Driver | Bus Fall & MUX |
| 3a : x Line Driver | 1 : Memory Cell Array | 3a : x Line Driver | 1 : Memory Cell Array | 3a : x Line Driver |
| Bus Fall & MUX | 2a : y Line Driver | Bus Fall & MUX | 2a : y Line Driver | Bus Fall & MUX |

FIG. 31A
FIG. 31B
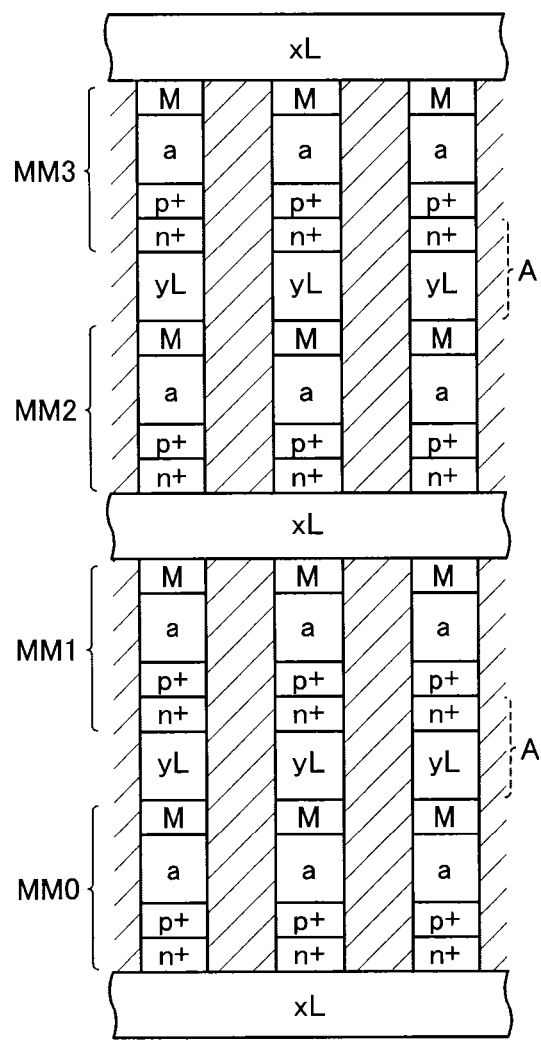
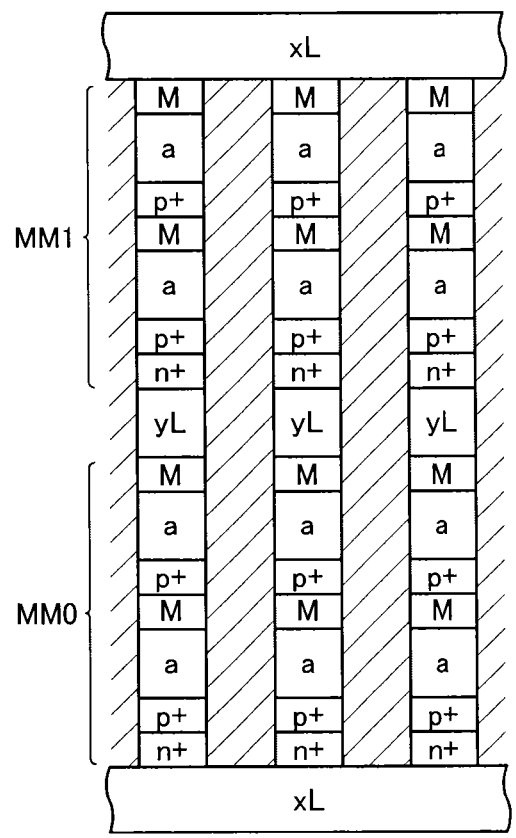

SEMICONDUCTOR MEMORY DEVICE AND METHOD OF CONTROLLING THE SAME

CROSS-REFERENCE TO RELATED APPLICATIONS

This application is based upon and claims the benefit of priority from the prior Japanese Patent Application No. 2012-069572, filed on Mar. 26, 2012, the entire contents of which are incorporated herein by reference.

BACKGROUND

1. Field

The embodiments described herein relate to a semiconductor memory device and a method of controlling the same.

2. Description of the Related Art

Flash memory in which memory cells having a floating gate structure are NAND connected or NOR connected to configure a cell array is well known as a conventional electrically rewritable nonvolatile memory. In addition, ferroelectric memory is also known as a nonvolatile memory capable of being accessed randomly at high speed.

At the same time, resistance varying type memory that uses a variable resistance element for a memory cell is proposed as a technology for achieving further miniaturization of memory cells. The following are known as variable resistance elements, namely: a phase change memory element that has its resistance value changed by a change in state of crystallization/amorphousness of a chalcogenide compound; a MRAM element that employs resistance change due to a tunnel magneto-resistance effect; a polymer ferroelectric RAM (PFRAM) element that has a resistance element formed by a conductive polymer; a ReRAM element that has resistance change caused by an electrical pulse application; and so on.

ReRAM generally adopts a memory cell array of a so-called cross-point type, in which wiring is shared between memory cell mats and in which a current rectifying direction of memory cells is inverted via wiring layers.

BRIEF DESCRIPTION OF THE DRAWINGS

FIG. 21 is a plan view showing a layout of the memory cell array and peripheral circuits in same semiconductor memory device.

FIGS. 31A and 31B are cross-sectional views showing a difference in stacking structure between the first and second embodiments and the third embodiment.

DETAILED DESCRIPTION

A semiconductor memory device according to an embodiment comprises: a memory cell array configured having a plurality of memory cell mats stacked therein, each of the memory cell mats including a plurality of first lines, a plurality of second lines intersecting the first lines, and a plurality of memory cells connected to the first lines and the second lines, and the memory cell mats being stacked such that the first lines and the second lines are shared alternately by each of the memory cell mats; and a peripheral circuit for applying a voltage to the memory cell array. Each of the memory cells has a variable resistance characteristic and a current rectifying characteristic, and adopts one end as an anode and the other end as a cathode according to the current rectifying characteristic. An orientation from the anode toward the cathode of all of the memory cells in the memory cell array is identical. The peripheral circuit, during setting, resetting, and read operations of a selected memory cell, adopts one of the first line and the second line connected to an anode side of the selected memory cell as a selected bit line and applies to the selected bit line a selected bit line voltage which is a voltage on the anode side required in the setting, resetting, and read operations, and adopts the other of the first line and the second line connected to a cathode side of the selected memory cell as a selected word line, and applies to the selected word line a selected word line voltage which is a voltage on the cathode side required in the setting, resetting, and read operations.

A semiconductor memory device and a method of controlling the same according to embodiments are described below with reference to the drawings.

First Embodiment

[Overall Configuration]

Figure 1:
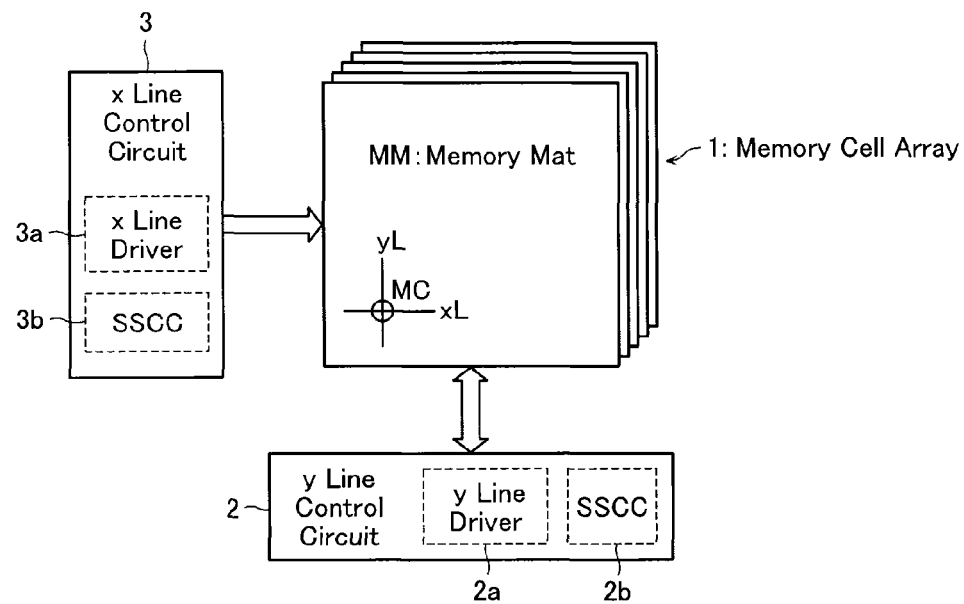
FIG. 1 is a block diagram showing an overall configuration of a semiconductor memory device according to a first embodiment.

FIG. 1 is a block diagram of a semiconductor memory device according to an embodiment. This semiconductor memory device comprises a memory cell array 1, and further comprises a y line control circuit 2 and an x line control circuit 3 as a peripheral circuit for controlling data erase, data write, and data read in this memory cell array 1. The memory cell array 1 includes a plurality of memory cell mats MM that are stacked. Each of the memory cell mats MM includes a plurality of y lines yL and a plurality of x lines xL that intersect one another, and memory cells MC connected to each of intersection positions of these y lines yL and x lines xL. As mentioned in detail later, the x lines xL and y lines yL are both configured capable of operating as bit lines BL and word lines WL. Therefore, the y line control circuit 2 and the x line control circuit 3 are basically configured similarly, and have an identical function.

The y line control circuit 2 is connected to the y lines yL of the memory cell mat MM. When the y lines yL operate as the bit lines BL, the y line control circuit 2 controls the y lines yL to perform data erase of the memory cells MC, data write to the memory cells MC, and data read from the memory cells MC, and when the y lines yL operate as the word lines WL, the y line control circuit 2 selects the y lines yL. In addition, the y line control circuit 2 includes: a y line driver 2a including a decoder and a multiplexer for selecting the y lines yL and supplying the y lines yL with a voltage required in an access operation; and a SSCC circuit 2b (first drive/detection circuit) for detecting a current flowing in the memory cells MC during a read operation to judge data stored by the memory cells MC.

The x line control circuit 3 is connected to the x lines xL of the memory cell mat MM. When the x lines xL operate as the bit lines BL, the x line control circuit 3 controls the x lines xL to perform data erase of the memory cells MC, data write to the memory cells MC, and data read from the memory cells MC, and when the x lines xL operate as the word lines WL, the x line control circuit 3 selects the x lines xL. In addition, the x line control circuit 3 includes: an x line driver 3a including a decoder and a multiplexer for selecting the x lines xL and supplying the x lines xL with a voltage required in an access operation; and a SSCC circuit 3b (second drive/detection circuit) for detecting a current flowing in the memory cells MC during a read operation to judge data stored by the memory cells MC.

[Memory Cell Array 1]

Figure 2:
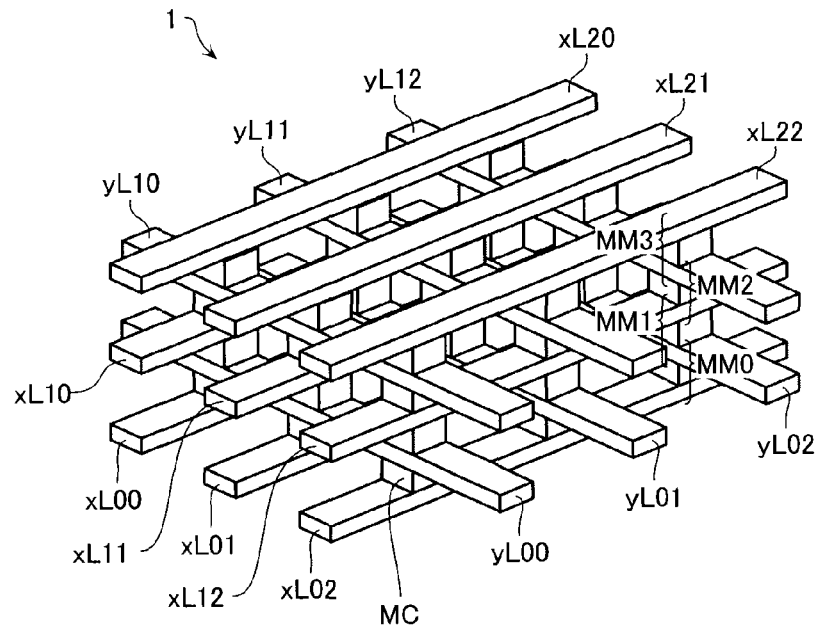
FIG. 2 is a perspective view showing a memory cell array structure in same semiconductor memory device.

FIG. 2 is a schematic perspective view showing a part of the memory cell array 1.

The memory cell array 1 is a cross-point type memory cell array. Each of the memory cell mats MM in the memory cell array 1 includes a plurality of the y lines yL disposed in parallel and a plurality of the x lines xL disposed in parallel in a direction intersecting these y lines yL. The memory cells MC are disposed at each of the intersections of the y lines yL and the x lines xL so as to be sandwiched by both lines. As mentioned previously, the memory cell array 1 is formed by stacking a plurality of such memory cell mats MM in multiple layers. Fellow memory cell mats MM adjacent in an up-and-down direction share the x lines xL or the y lines yL. In the case of FIG. 2, the memory cell mat MM0 in the lowermost layer of the memory cell array 1 and the memory cell mat MM1 above and adjacent to this memory cell mat MM0 share the y lines yL00-yL02.

Figure 3:
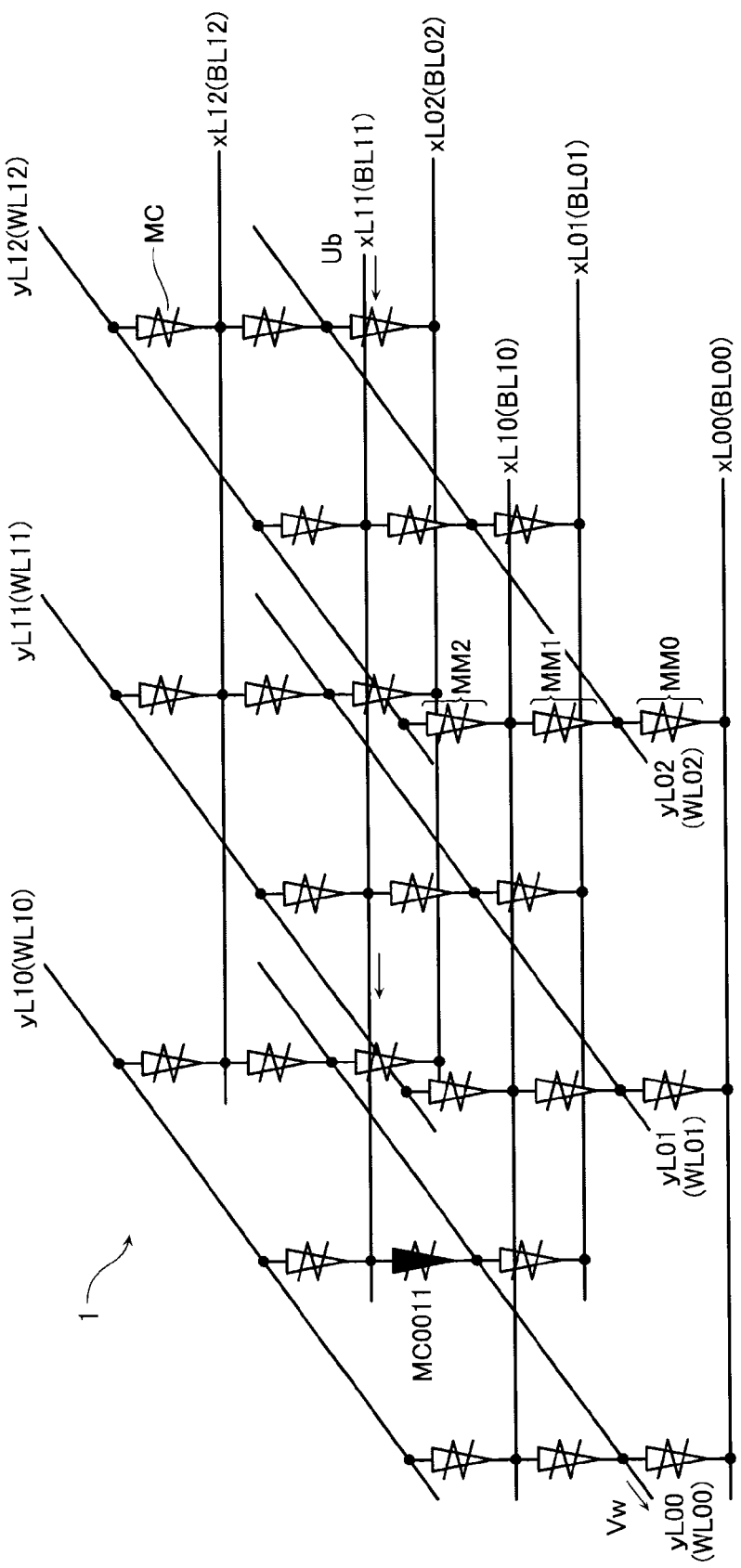
FIG. 3 is an equivalent circuit diagram of same memory cell array.

FIG. 3 is an equivalent circuit diagram of the memory cell array 1 shown in FIG. 2. As described in detail later, the memory cells MC have a variable resistance characteristic and a non-ohmic characteristic, and an orientation of large current flow (current rectifying direction) is shown by an elongated triangle. Therefore, a base end side of the triangle represents an anode, and a pointed side of the triangle represents a cathode.

As shown in FIG. 3, in the semiconductor memory device according to the present embodiment, the current rectifying direction of all the memory cells MC in the memory cell array 1 is the same. Such a configuration allows manufacturing to be performed easily compared to the case of manufacturing by inverting the current rectifying direction on a memory cell mat basis, and, moreover, thus enables a significant reduction in manufacturing costs.

Such a configuration of the memory cell array 1 necessitates switching functions of the x lines xL and the y lines yL according to a position of a selected memory cell MC. Hereafter, when the selected memory cell MC has a y line yL connected to its anode side and an x line xL connected to its cathode side, the y line yL is called a bit line BL and the x line xL is called a word line WL, and, when the selected memory cell MC has an x line xL connected to its anode side and a y line yL connected to its cathode side, the x line xL is called a bit line BL and the y line yL is called a word line WL. In addition, the bit line BL connected to the selected memory cell MC is called a selected bit line BL and the word line WL connected to the selected memory cell MC is called a selected word line WL.

Now, when accessing the memory cell MC0011 in FIG. 3, the x line xL11 (selected bit line BL11) connected to an anode side of the memory cell MC0011 is supplied with a selected bit line voltage Ub (=Vacc), and the y line yL00 (selected word line WL00) connected to a cathode side of the memory cell MC0011 is supplied with a selected word line voltage Vw (=ground voltage VSS). This results in current flowing as indicated by the arrows in the drawing, whereby access is performed. It is important what kind of potential is provided to the y lines yL (word lines WL) or x lines xL (bit lines BL) connected to the memory cells MC other than the selected memory cell MC0011, and a configuration is required enabling the memory cell MC0011 to be reliably accessed.

[Memory Cell MC]

The memory cell MC in the semi conductor memory device according to the present embodiment is asymmetric having voltage-current characteristics that differ according to a voltage application direction as described later. When such asymmetric resistance varying memory is disposed threedimensionally and the cross-point access described using FIG. 3 is performed, power consumption can be reduced by adopting a floating access system. Accordingly, conditions the memory cell MC should fulfill in order for floating access to be applied to the semiconductor memory device according to the present embodiment are described.

Figure 4:
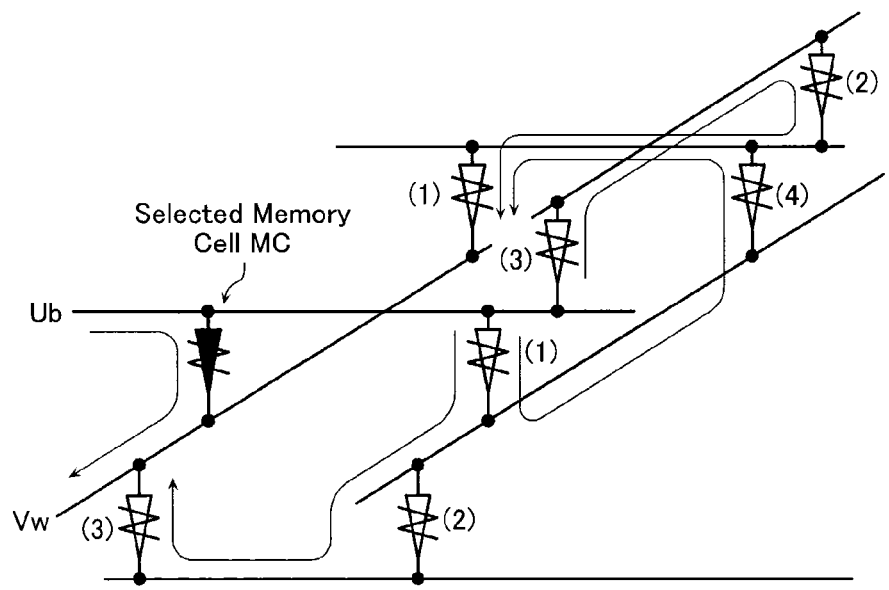
FIG. 4 is a circuit diagram showing a situation when a forward direction voltage is applied to a selected memory cell in same semiconductor memory device.

In the floating access system, the selected bit line BL and the selected word line WL connected to the selected memory cell MC are applied with, respectively, the selected bit line voltage Ub and the selected word line voltage Vw, and other x lines xL and y lines yL are set to a floating state. FIG. 4 is a view showing a situation when a forward direction (current rectifying direction) voltage is applied to the selected memory cell MC.

When performing a setting operation in the selected memory cell MC, the selected bit line voltage Ub is set to a high potential and the selected word line voltage Vw is set to a low potential to apply a setting voltage Vset to the selected memory cell MC. When voltages are applied in this way, the unselected memory cells MC connected to the selected bit line BL and the unselected memory cells MC connected to the selected word line WL ((3) in the drawing) in unselected memory cell mats MM positioned above and below the selected memory cell mat MM including the selected memory cell MC are applied with a reverse direction voltage via two forward direction biased memory cells ((1) and (2) in the drawing), and are subject to disturb in a resetting direction. Similarly, unselected memory cells ((4) in the drawing) in the selected memory cell mat MM also are applied with a reverse direction voltage via two forward direction biased memory cells MC (two (1)s in the drawing), and are subject to disturb in the resetting direction.

In order to prevent mistaken resetting of memory cells MC applied with a reverse direction voltage, an applied reverse direction voltage is preferably no more than a resetting voltage Vreset. That is, if a dead-band voltage to be described later of a memory cell MC is assumed to be $\delta$, then the setting voltage Vset and the resetting voltage Vreset are preferably set to satisfy a relationship Vset≤Vreset+2$\delta$. In order to secure a dead-band voltage of the memory cell MC, a cell structure may be configured as, for example, Ag/a-Si/n-Si, or Ag/a-Si/p-Si/n-Si.

Note that when performing a resetting operation in the selected memory cell MC, a reverse direction voltage applied to unselected memory cells MC is a voltage no more than an intermediate voltage Vm to be described later, hence the problem of mistaken resetting does not arise. In addition, the voltage applied to unselected memory cells MC is determined as conventionally in a self-aligning manner according to a place in the memory cell mat MM.

Figure 5:
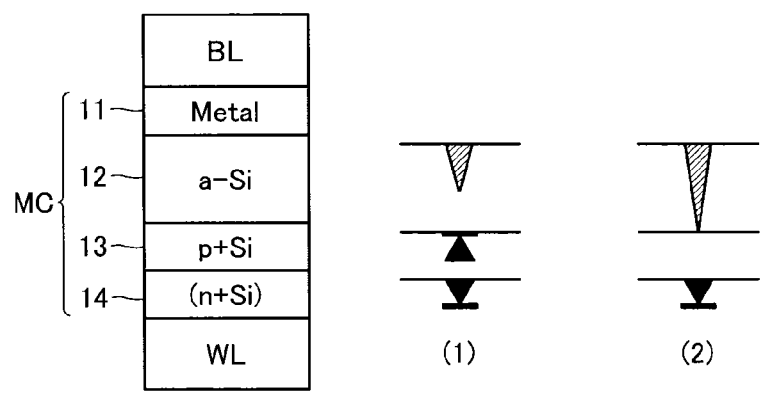
FIG. 5 is a schematic view for explaining a configuration and operation of same memory cell.
Figure 6:
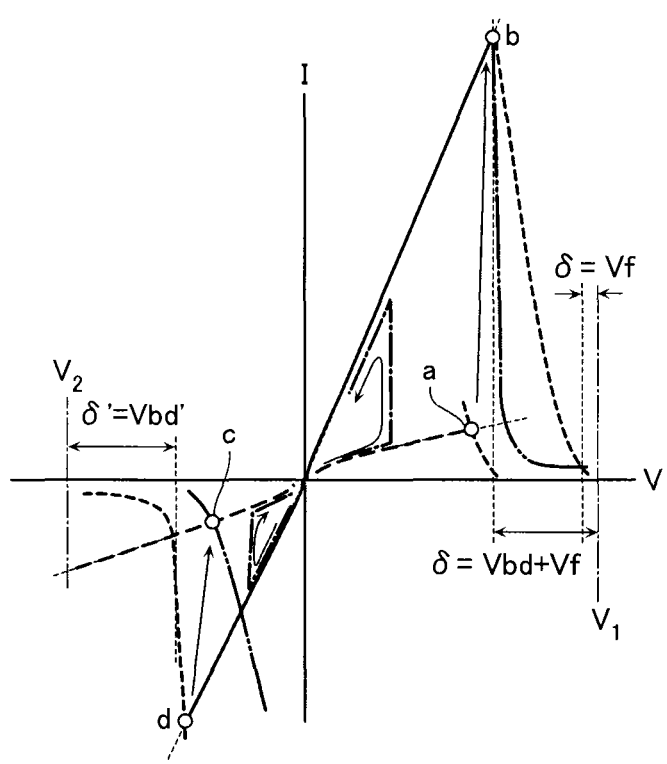
FIG. 6 is a graph showing current-voltage characteristics of same memory cell.

Next, an example of configuration of the memory cell MC according to the present embodiment is described. FIG. 5 is a schematic view for explaining a configuration and a set state and reset state in the memory cell MC according to the present embodiment, and FIG. 6 shows current-voltage characteristics of the memory cell MC according to the present embodiment. Note that ion memory is considered here as a representative resistance varying memory element. However, the configuration of the element does not matter provided that the element is an element of a kind capable of being changed between a low-resistance state and a high-resistance state by a voltage applied and a polarity of that voltage, capable of maintaining the resistance state to a certain extent, and in which a dead-band voltage to be described later is present in a zero bias vicinity.

As shown in the leftmost schematic structural diagram of FIG. 5, the memory cell MC according to the present embodiment includes, stacked in order from the bit line BL, a metal layer 11, an amorphous silicon layer 12, and doped polysilicon layers 13 and 14. The metal layer 11 functions as a generation source of metal ions. The amorphous silicon layer 12 becomes a medium for filaments of metal to grow. The doped polysilicon layer 13 becomes an opposite electrode of the metal layer 11. The doped polysilicon layer 13 has its doping type set to p type. The doped polysilicon layer 14 has an n type doping type and forms a diode together with the p type doped polysilicon layer 13 above the doped polysilicon layer 14. Since the amorphous silicon layer 12 appears to be n type with respect to the p type doped polysilicon layer 13 below the amorphous silicon layer 12, there is regarded as being a parasitic diode at a boundary between these amorphous silicon layer 12 and p type doped polysilicon layer 13. Note that although the doped polysilicon layer 14 is adopted in the present embodiment, the word line WL may be directly connected to the doped polysilicon layer 13.

The right side of the configurative diagram in FIG. 5 shows schematic views of two cell states as views schematically expressing states of this memory cell MC. A metal filament is shown by a downwardly directed vertically long triangle. The diode formed by the doped polysilicon layers 13 and 14 adopts a bit line BL side as an anode and a word line WL side as a cathode, and a parasitic diode formed at the boundary between the amorphous silicon layer 12 and the doped polysilicon layer 13 is reversely directed and adopts the word line WL side as an anode and the bit line BL side as a cathode. (1) in the drawing is the case where the filament of the memory cell MC does not penetrate the amorphous silicon layer 12. In this case, the parasitic diode appears. (2) in the drawing is the case where the filament of the memory cell MC penetrates the amorphous silicon layer 12. In this case, the parasitic diode does not appear.

FIG. 6 shows electrical characteristics of the memory cell MC including also the bit line BL and word line WL. In the drawing, the horizontal axis V shows a potential of the bit line BL with respect to the word line WL. The first quadrant shows the case where a potential of the bit line BL side with respect to the word line WL side is high, and the third quadrant shows the case where the potential of the bit line BL side with respect to the word line WL side is low. The vertical axis I shows current assuming flow from the bit line BL side to the word line WL side to be a positive direction.

Focusing separately on the characteristics of the variable resistance element, the variable resistance element shows ohmic characteristics. The set state which is a low-resistance state is expressed by a large inclination like the solid line passing through the origin, and the reset state which is a high-resistance state is expressed by a small inclination like the broken line passing through the origin. A state where the filament is on the point of contacting the doped polysilicon layer 13 which is the opposite electrode is called a weak reset state. Characteristics of the weak reset state are the same as those of the reset state, but undergo a change like that shown by the dashed-dotted line in the first quadrant of easily undergoing transition to the set state when the potential of the bit line BL rises. In addition, when the filament has only just contacted the opposite electrode, the characteristic is the same as that of the set state, but undergoes a change like that shown by the dashed-dotted line in the third quadrant of contact being immediately broken and undergoing transition to the high-resistance reset state when the potential of the word line WL rises.

On the other hand, the dashed-two dotted line and dashed line of FIG. 6 show diode characteristics. The diode characteristics are displayed overlapping the characteristics of the variable resistance element. A voltage applied to the bit line BL or the word line WL is distributed to the variable resistance element and the diode, hence the more the voltage applied to the variable resistance element increases, the more the voltage applied to the diode decreases. Therefore, taking the voltage applied to the bit line BL or the word line WL as a reference, the voltage applied to the diode is expressed increasing in a reverse direction in the horizontal axis direction to the voltage applied to the variable resistance element. As a result, the intersection point of the characteristics of the variable resistance element and the characteristics of the diode represents an operation point.

Now, as shown in FIG. 6, the diode characteristics include characteristics of the parasitic diode shown by the dashed-two dotted line and the ever-present fixed diode shown by the dashed line. That is, in the first quadrant, when the parasitic diode appears (during the reset state), the parasitic diode characteristic is a reverse bias characteristic. Accordingly, if a potential of the bit line BL side with respect to the word line WL side is assumed to be a voltage V1, then when the variable resistance element is in a reset state, the diode characteristics are such that when a reverse bias is applied of an amount of a voltage (Vbd+Vf) which is the sum of a forward direction drop voltage Vf of the fixed diode from the voltage V1 and a breakdown voltage Vbd of the parasitic diode, the diode current increases sharply. The intersection point a of these diode characteristics (dashed line) and the characteristics of the variable resistance element in the reset state (broken line) is an operation point of the reset state. Moreover, this voltage Vbd+Vf is the dead-band voltage δ.

On the other hand, when the variable resistance element is in a set state, the parasitic diode disappears, hence diode characteristics become only forward direction characteristics of the fixed diode. Accordingly, the diode characteristics are such that when a forward direction voltage exceeding the forward direction drop voltage Vf of the fixed diode from the voltage V1 is applied, the current increases, and the dead-band voltage is Vf. In this case, the intersection point b of the characteristics of the variable resistance element in the set state (solid line) and the forward direction characteristics of the fixed diode is an operation point of the set state. Therefore, when the voltage V1 is the setting voltage Vset, transition from the reset state to the set state becomes transition from the operation point a to the operation point b.

In the third quadrant, the fixed diode has reverse bias characteristics. In the reset state where the parasitic diode appears, the parasitic diode characteristics are forward bias characteristics. As a result, when the variable resistance element is in a reset state, the diode characteristics are such that, taking a voltage V2 (negative voltage) of the bit line BL side with respect to the word line WL side as a reference, the forward direction current of the parasitic diode, after heading in a horizontal axis positive direction and exceeding a breakdown voltage Vbd' of the fixed diode, then increases. The intersection point c of the dashed-two dotted line showing these parasitic diode characteristics and the broken line showing characteristics of the variable resistance element in the reset state is an operation point of the reset state.

In addition, when the variable resistance element is in a set state, the parasitic diode disappears, hence diode characteristics become only reverse bias characteristics of the fixed diode. In this case, the voltage Vbd' becomes a dead-band voltage δ'. The intersection point d of the diode characteristics that current increases sharply at a point of exceeding the breakdown voltage Vbd' of the fixed diode from the voltage V2 (dashed line) and the characteristics of the variable resistance element in a set state (solid line) is an operation point of the set state. Therefore, when the voltage V2 is the resetting voltage Vreset, transition from the set state to the reset state becomes transition from the operation point d to the operation point c.

Note that in FIG. 6, although no consideration is made of a voltage due to metal ionizing in the metal layer 11, this voltage is included in the dead-band voltages δ and δ'.

[Operation]

Next, operation of the semiconductor memory device according to the present embodiment is described. The semiconductor memory device according to the present embodiment, when not performing a setting operation, a resetting operation, or a read operation, is in a hold state to be described later, and, when performing the setting operation, the resetting operation, or the read operation, performs a standby operation to be described later prior to these operations, and after performing the standby operation, performs the setting operation, the resetting operation, or the read operation. Note that the description below exemplifies the case assuming the x line xL to be the bit line BL and the y line yL to be the word line WL. In addition, the memory cell MC has a dead-band voltage 6 in a zero bias vicinity of the forward direction, hence leak current in two or more memory cells MC applied with a forward direction bias (hereafter referred to as forward direction bias cells) is not considered. Similarly, leak current in memory cells MC applied with a reverse direction bias is not considered. Furthermore, in the description below, capacitive coupling between adjacent lines is assumed to be 100%.

[Hold State]

Figure 7:
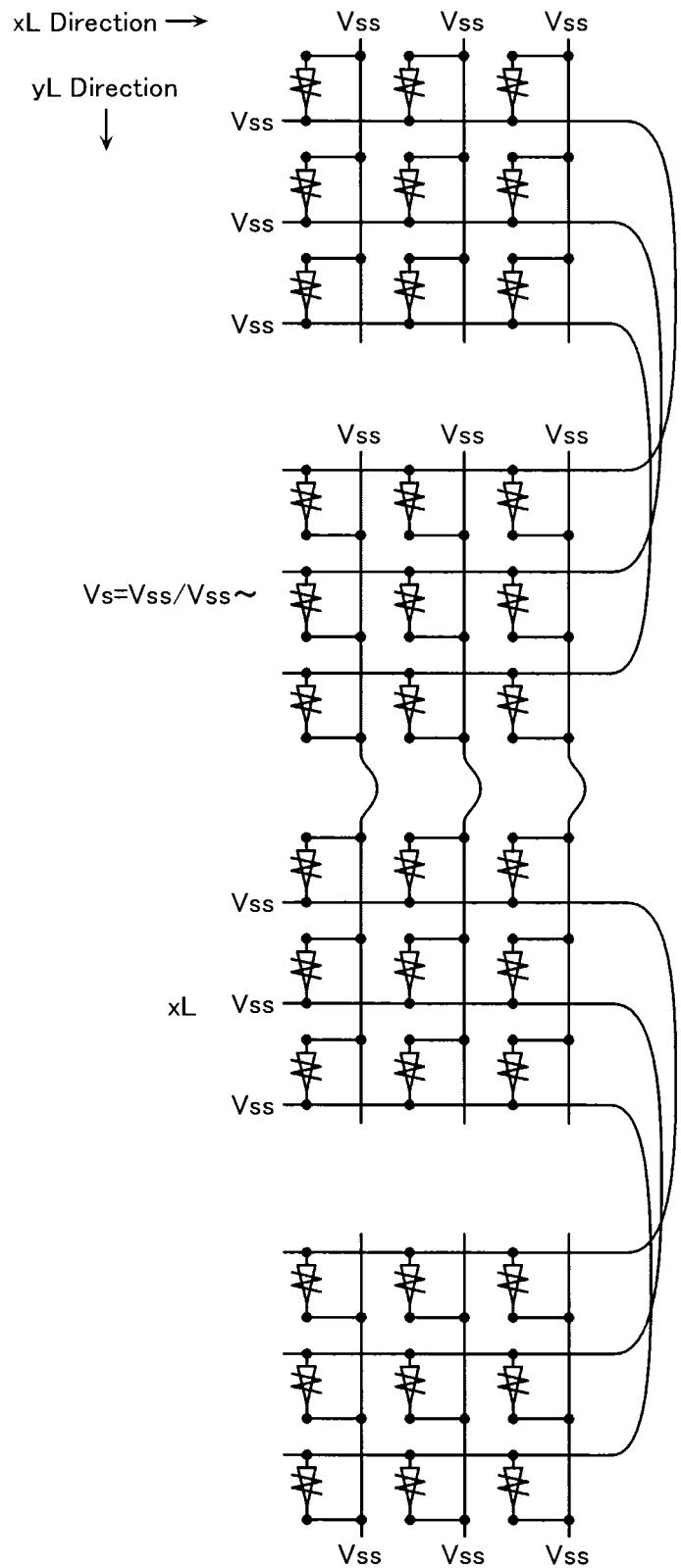
FIG. 7 is a circuit diagram for explaining a hold state in same semiconductor memory device.

As shown in FIG. 7, in a memory cell array 1 including memory mats MM each configured from, for example, 3×3 memory cells MC and having x lines xL and y lines yL shared by memory mats MM one above or below the other, a state prior to beginning access, that is a time of maintaining a state of the memory cells MC is called hold, and all of the bit lines BL and word lines WL are set to a ground level Vss or its equivalent Vs (=Vss/Vss~:~ indicates a floating level). In this state, the cells are in a state that their resistance state is maintained and data is fixed in the memory cell array 1. None of the memory cells is applied with a potential bias.

[Setting Operation and Read Operation]

Figure 8:
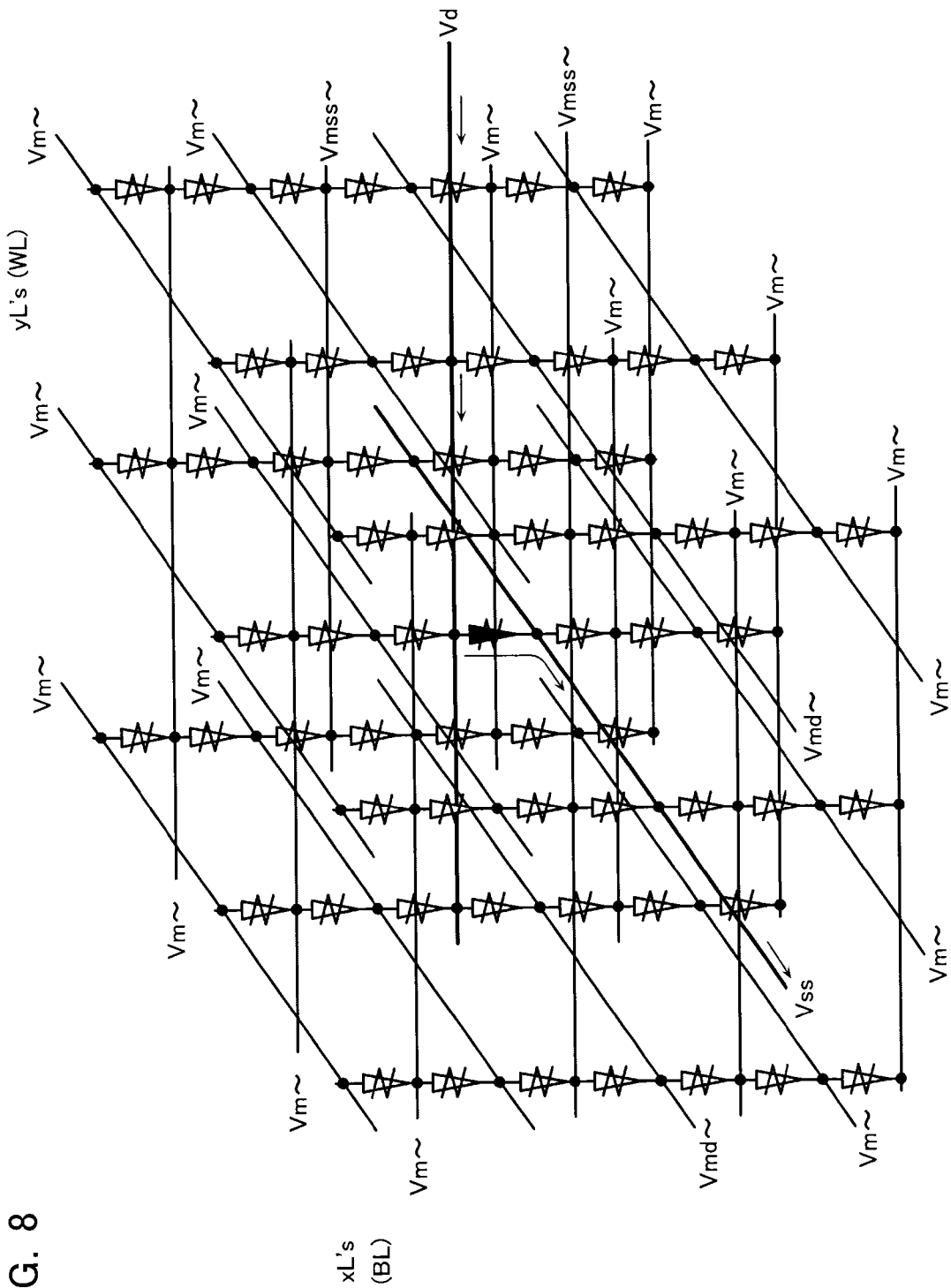
FIG. 8 is a circuit diagram for explaining a setting operation and a read operation in same semiconductor memory device.

During the setting operation and the read operation, as shown in FIG. 8 for the case where capacitive coupling between lines is not considered, the following kind of control should be performed. That is, in the standby operation, all lines are set to an intermediate voltage Vm, and in the setting operation or the read operation, a selected bit line BL is set to a certain voltage Vd and a selected word line WL is set to the ground voltage Vss, and other unselected bit lines BL and word lines WL are set to a floating state. As a result, a voltage V of unselected word lines WL connected via a forward direction bias cell having the selected bit line BL on an anode side is distributed in a floating voltage Vmd~ of about (certain voltage Vd)−(dead-band voltage δ)=Vmd, and a voltage U of unselected bit lines BL connected via a reverse direction bias cell having the selected word line WL on a cathode side is distributed in a floating voltage Vmss~ of about (dead-band voltage δ)−(ground voltage Vss)=Vmss. Note that a voltage of other unselected bit lines BL and unselected word lines WL is distributed in a voltage Vm~ of about the intermediate voltage Vm. When using the above-described memory cell MC, the problem of disturb does not occur with this kind of voltage distribution.

However, in practice, capacitive coupling occurs between adjacent lines, and when shifting from the standby operation to the setting operation or the read operation, a voltage change occurs in lines adjacent to the selected bit line BL and the selected word line WL, and so on. Therefore, in the present embodiment, applied voltages during the standby operation are set to prevent disturb due to effects of capacitive coupling.

Figure 9A:
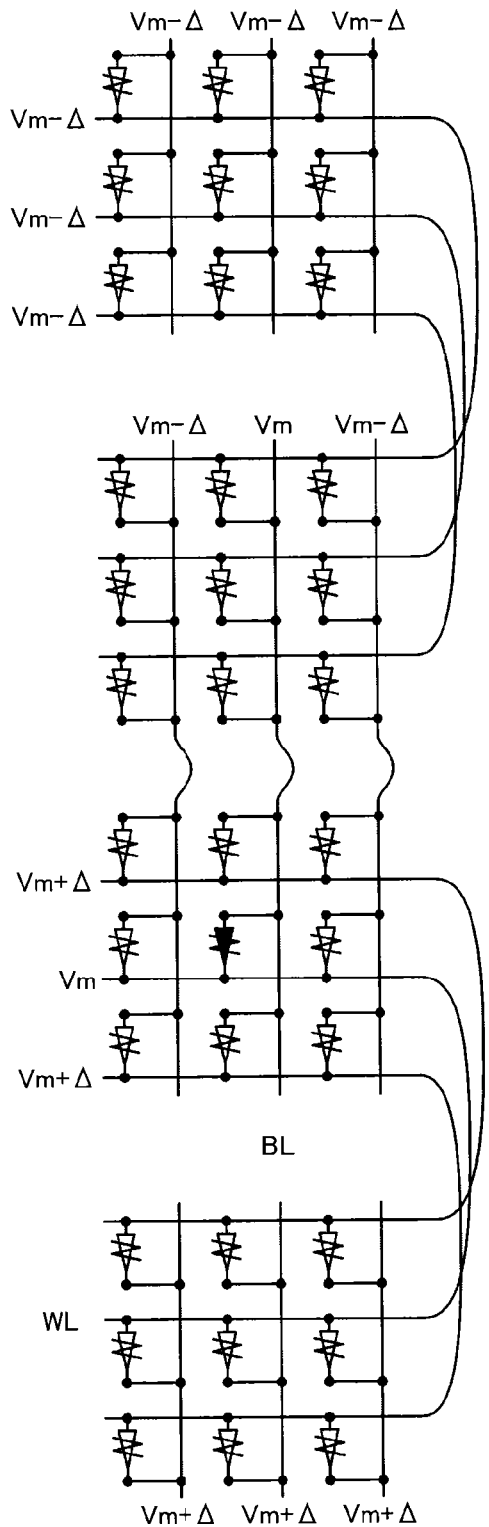
FIGS. 9A and 9B are circuit diagrams for explaining the setting operation and the read operation in same semiconductor memory device.
Figure 9B:
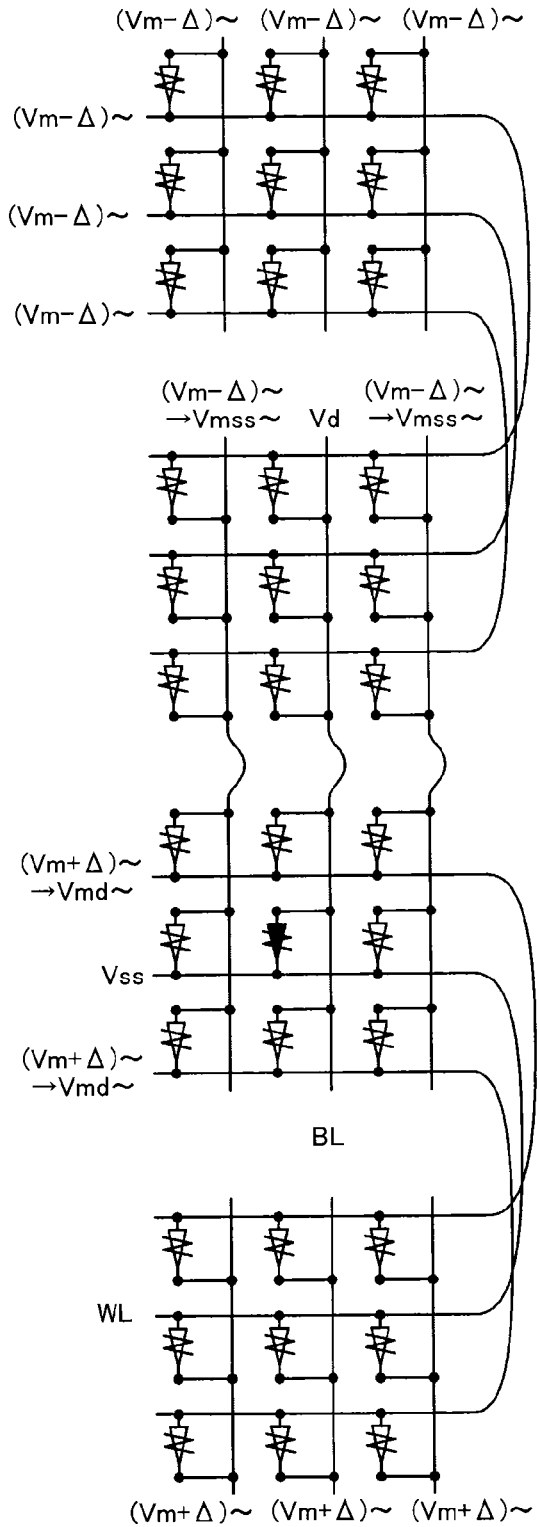
Figure 10:
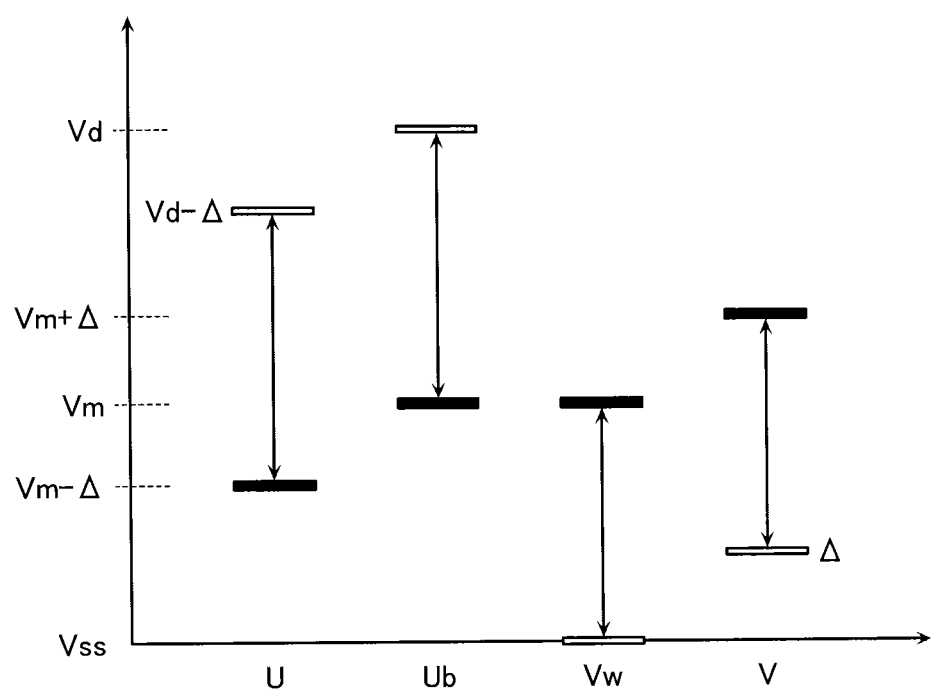
FIG. 10 is a schematic view for explaining the setting operation and the read operation in same semiconductor memory device.

FIGS. 9A-11 are views showing a voltage Ub of the selected bit line BL, the voltage U of the unselected bit lines BL in an identical wiring layer to the selected bit line BL, a voltage Vw of the selected word line WL, and the voltage V of the unselected word lines WL in an identical wiring layer to the selected word line WL, during the standby operation and during the setting operation and read operation. Note that FIG. 9A shows applied voltages during standby and FIG. 9B shows applied voltages during the setting operation and during the read operation. Note also that in FIG. 10, a setting voltage of each of the lines during the standby operation is indicated by a heavy black bar, and a voltage state of each of the lines during the setting operation and during the read operation is indicated by an outline bar.

In order to suppress a mistaken operation on the unselected memory cells MC due to capacitive coupling, in the standby operation, the selected bit line BL and the selected word line WL are applied with the intermediate voltage Vm, the unselected bit lines BL in an identical wiring layer to the selected bit line BL and the unselected bit lines BL and unselected word lines WL disposed more on an anode side of the selected memory cell MC than the selected bit line BL are applied with a voltage Vm−Δ which is lower than the intermediate voltage Vm, and the unselected word lines WL in an identical wiring layer to the selected word line WL and the unselected bit lines BL and unselected word lines WL disposed more on a cathode side of the selected memory cell MC than the selected word line WL are applied with a voltage Vm+Δ which is higher than the intermediate voltage Vm. Now, unselected memory cells MC connected to unselected bit lines BL applied with the voltage Vm−Δ and adjacent word lines WL applied with the voltage Vm+Δ are applied with a reverse direction voltage of 2Δ, hence, to prevent mistaken resetting, it is required that 2Δ<Vreset, therefore, the above-mentioned Δ is set to a voltage of no more than half of Vreset.

Next, in order to perform the setting operation or the read operation, the selected bit line BL is applied with the voltage Vd, the selected word line WL is applied with the ground voltage Vss, and the unselected bit lines BL and unselected word lines WL are set to a floating state. The voltage Vd in the setting operation is a voltage Vset sufficient to cause the memory cell MC to undergo transition to the set state, and the voltage Vd in the read operation is a read voltage Vread. Accompanying this voltage change, capacitive coupling causes the voltage of the unselected bit lines BL adjacent to the selected bit line BL to rise sharply to Vd−Δ and the voltage of the unselected word lines WL adjacent to the selected word line WL to fall sharply to Δ. Therefore, these memory cells MC connected to the unselected bit lines BL and the selected word line WL and memory cells MC connected to the selected bit line BL and the unselected word lines WL are rapidly applied with a forward direction voltage of Vd−Δ, hence to prevent mistaken setting, it is required that Vd−Δ<Vset.

Figure 11:
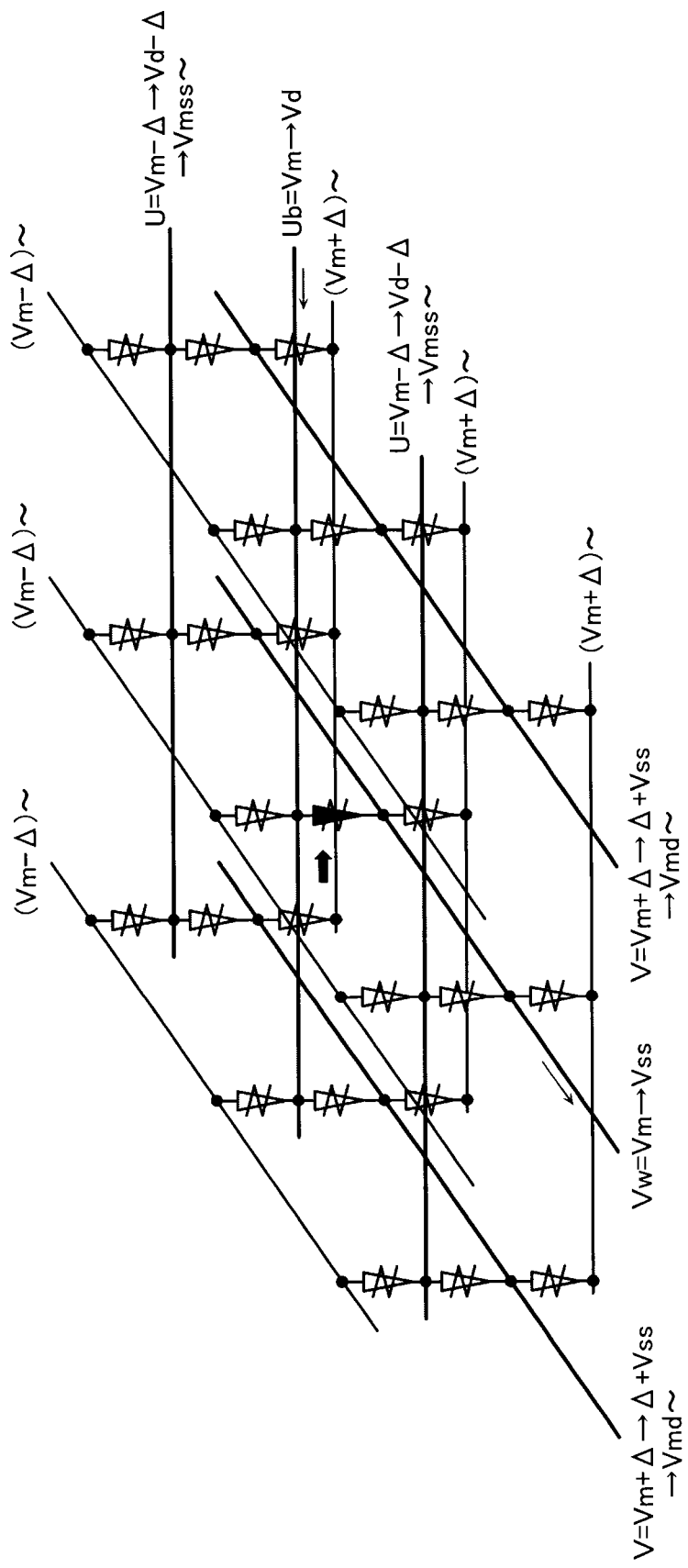
FIG. 11 is a circuit diagram for explaining the setting operation and the read operation in same semiconductor memory device.

Then, as shown in FIG. 11, a current flows from the unselected bit line BL in an identical wiring layer to the selected bit line BL, via the forward direction bias cell, into the selected word line WL, and the voltage U of the unselected bit lines BL in an identical wiring layer to the selected bit line BL is distributed in previously-mentioned Vmss~. Similarly, a current flows from the selected bit line BL, via the forward direction bias cell, into the unselected word line WL in an identical wiring layer to the selected word line WL, and the voltage V of the unselected word lines WL in an identical wiring layer to the selected word line WL is distributed in previously-mentioned Vmd~. In addition, the voltages U and V of the unselected bit lines BL and unselected word lines WL disposed more on an anode side of the selected memory cell MC than the selected bit line BL are distributed in a floating voltage (Vm−Δ)~ of about Vm−Δ, and the voltages U and V of the unselected bit lines BL and unselected word lines WL disposed more on a cathode side of the selected memory cell MC than the selected word line WL are distributed in a floating voltage (Vm+Δ)~ of about Vm+Δ. Note that the intermediate voltage Vm and Δ are set to maintain a stable state of such voltages.

Figure 12:
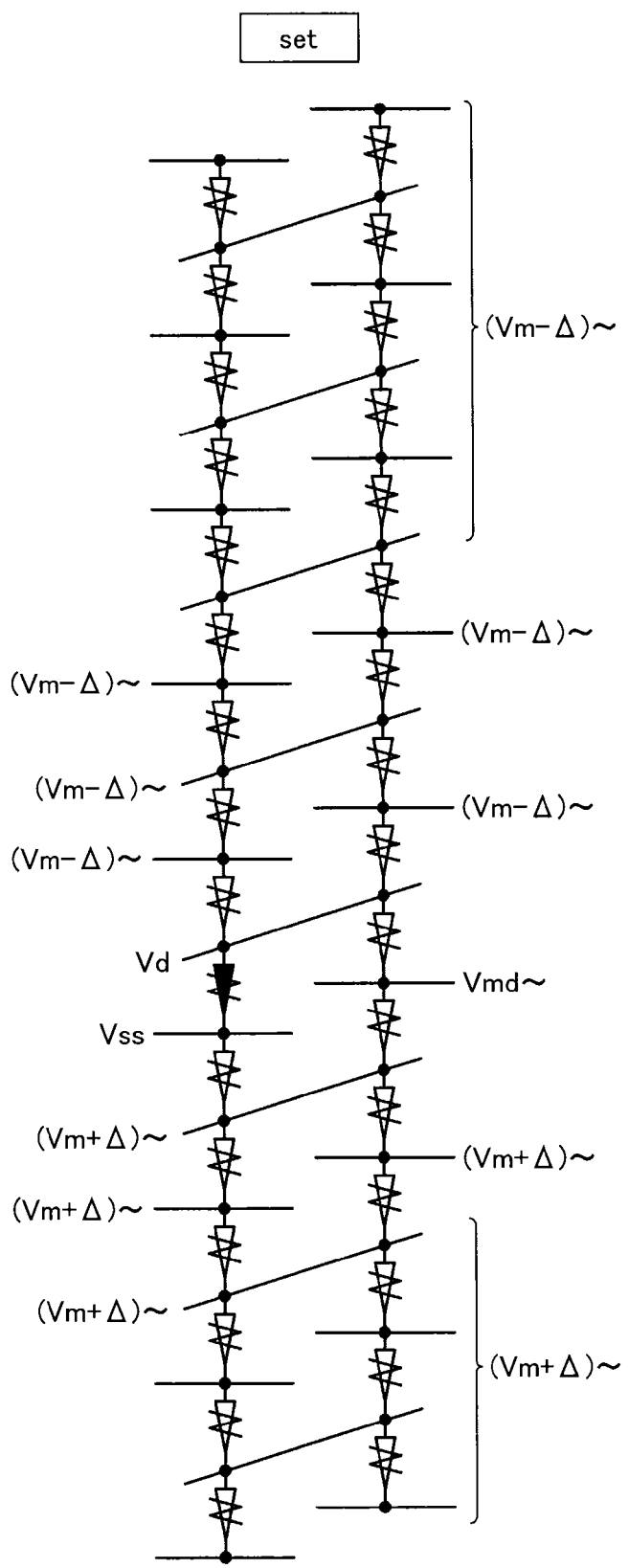
FIG. 12 is a circuit diagram for explaining the setting operation and the read operation in same semiconductor memory device.

Note that when voltages are set as above, the standby voltage differs between above and below the selected memory cell mat MM, and, as shown in FIG. 12, a voltage difference of 2Δ occurs. Moreover, setting of the standby voltage must be changed according to a condition of access, hence decoding of the kind where x lines xL and y lines yL are shared between adjacent memory cell mats MM is not possible.

[Resetting Operation]

Figure 13:
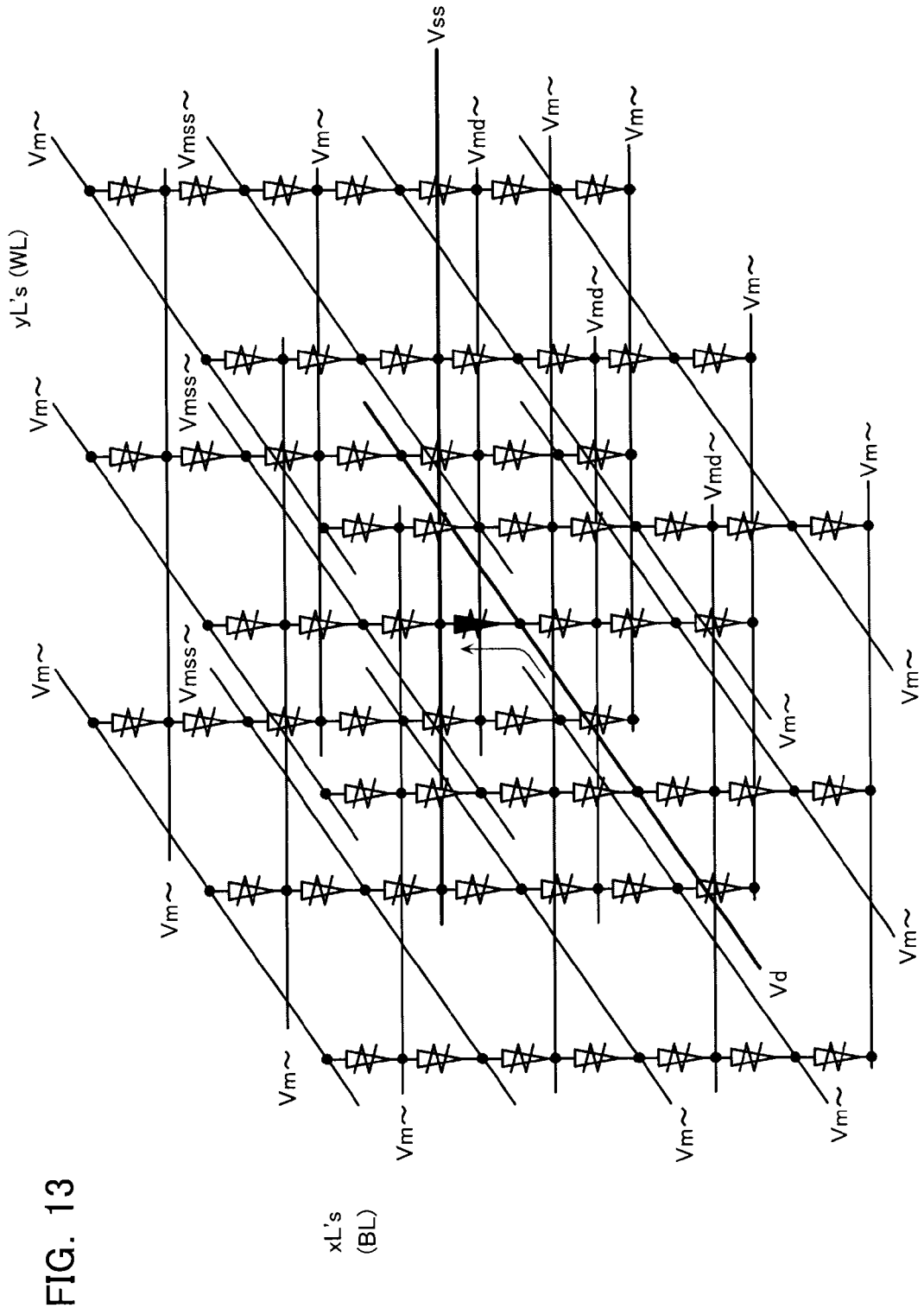
FIG. 13 is a circuit diagram for explaining a resetting operation in same semiconductor memory device.

Next, the resetting operation is similarly described. During the resetting operation, as shown in FIG. 13 for the case where capacitive coupling between lines is not considered, the following kind of control should be performed. That is, in the standby operation, all lines are set to an intermediate voltage Vm, and in the resetting operation, a selected bit line BL is set to the ground voltage Vss and a selected word line WL is set to the certain voltage Vd, and other x lines xL and y lines yL are set to a floating state. As a result, a voltage U of unselected bit lines BL connected to a forward direaction bias cell having the selected word line WL as an anode side is distributed in a floating voltage Vmd~, and a voltage V of unselected word lines WL connected to a reverse direction bias cell having the selected bit line BL as a cathode side is distributed in a floating voltage Vmss~. Note that the voltages U and V of other unselected bit lines BL and unselected word lines WL is distributed in a voltage Vm~ of about the intermediate voltage Vm. When using the above-described memory cell MC, the problem of disturb does not occur with this kind of voltage distribution either.

However, in practice, capacitive coupling occurs between adjacent lines, and when shifting from the standby operation to the resetting operation, a voltage change occurs in lines adjacent to the selected bit line BL and the selected word line WL, and so on. Therefore, in the present embodiment, applied voltages during the standby operation are set to prevent disturb due to effects of capacitive coupling.

Figure 14A:
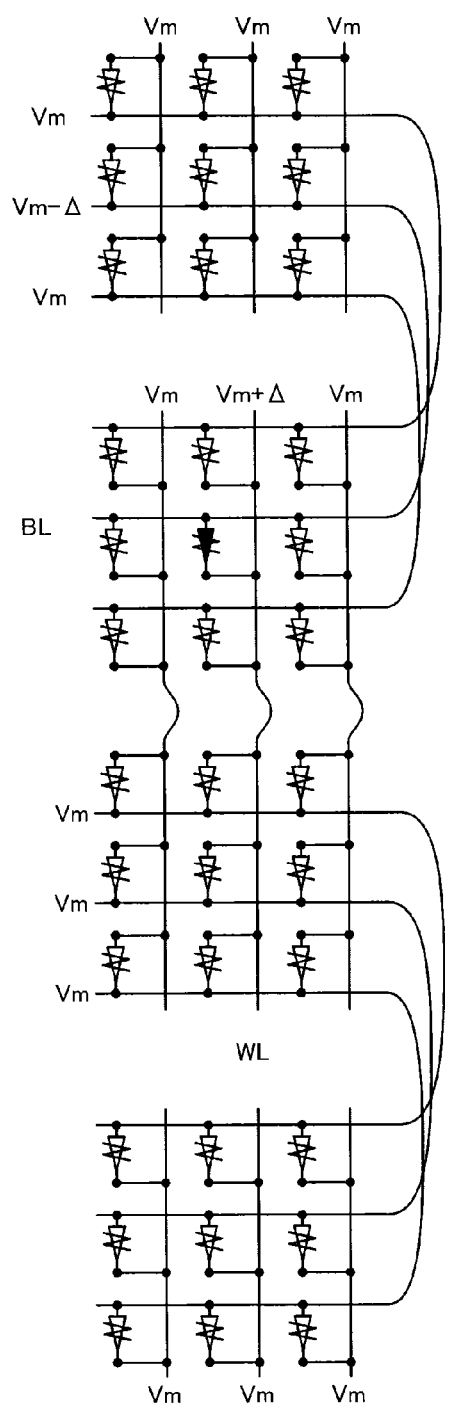
FIGS. 14A and 14B are circuit diagrams for explaining the resetting operation in same semiconductor memory device.
Figure 14B:
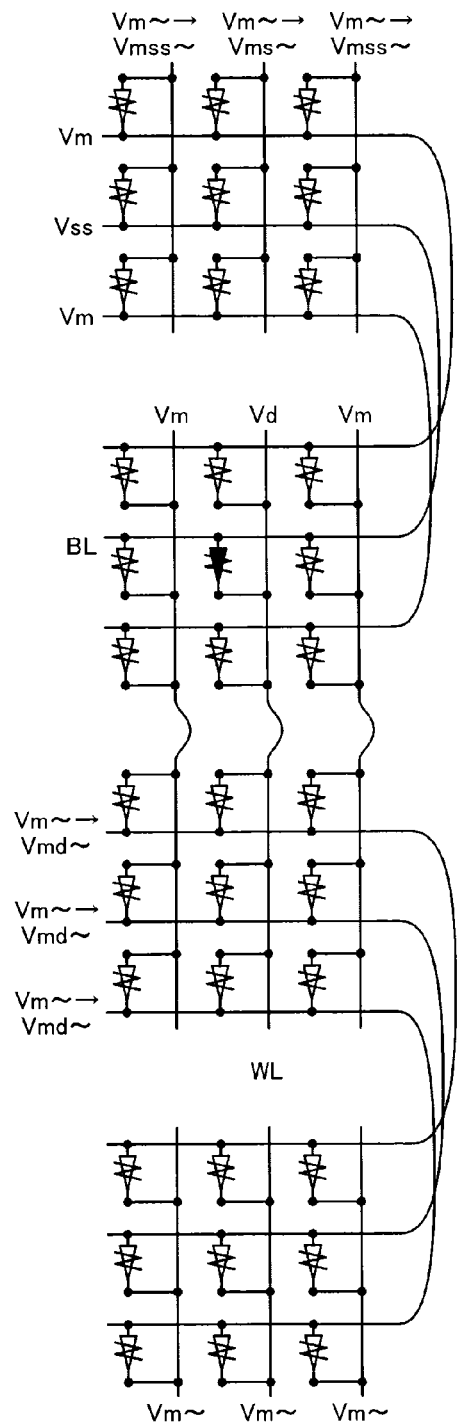
Figure 15:
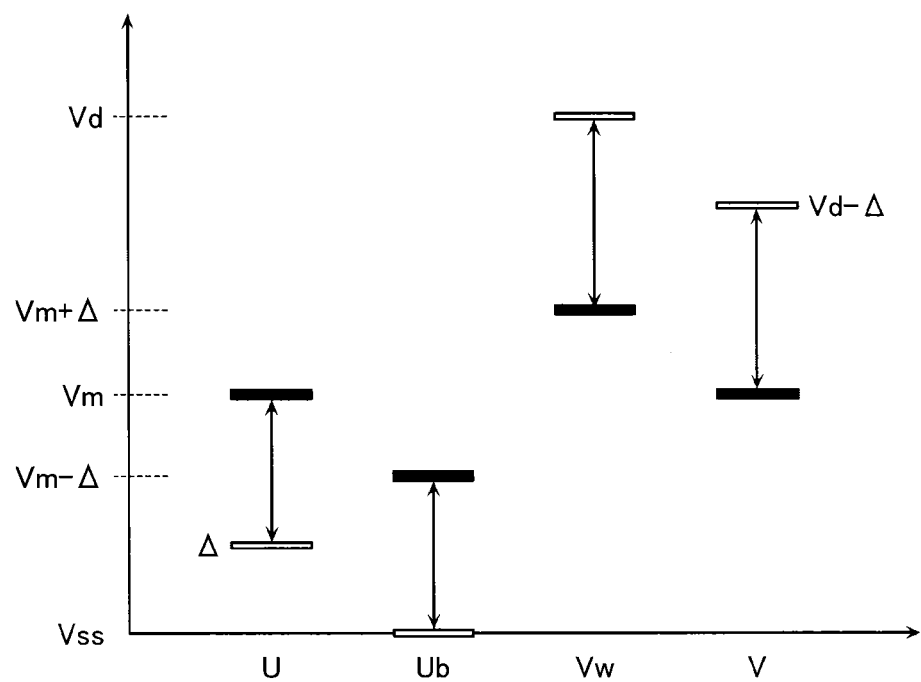
FIG. 15 is a schematic view for explaining the resetting operation in same semiconductor memory device.

FIGS. 14A-16 are views showing a voltage Ub of the selected bit line BL, the voltage U of the unselected bit lines BL in an identical wiring layer to the selected bit line BL, a voltage Vw of the selected word line WL, and the voltage V of the unselected word lines WL in an identical wiring layer to the selected word line WL, during the standby operation and during the resetting operation. Note that FIG. 14A shows applied voltages during standby and FIG. 14B shows applied voltages during the resetting operation. Note also that in FIG. 15, a setting voltage of each of the lines during the standby operation is indicated by a heavy black bar, and a voltage state of each of the lines during the resetting operation is indicated by an outline bar.

In order to suppress a mistaken operation on the unselected memory cells MC due to capacitive coupling, in the standby operation, the unselected bit lines BL and the unselected word lines WL are applied with the intermediate voltage Vm, the selected bit line BL is applied with a voltage Vm−Δ which is lower than the intermediate voltage Vm, and the selected word line WL is applied with a voltage Vm+Δ which is higher than the intermediate voltage Vm. Now, the selected memory cell MC is applied with a reverse direction voltage of 2Δ, and, similarly to in the setting operation, the above-mentioned Δ is set to a voltage of no more than half of Vreset.

Next, in order to perform the resetting operation, the selected bit line BL is applied with the ground voltage Vss, the selected word line WL is applied with the voltage Vd, and the unselected bit lines BL and unselected word lines WL are set to a floating state. The voltage Vd herein is the resetting voltage Vreset. Accompanying this, capacitive coupling causes the voltage of the unselected bit lines BL adjacent to the selected bit line BL to fall sharply to Δ and the voltage of the unselected word lines WL adjacent to the selected word line WL to rise sharply to Vd−Δ. Therefore, memory cells MC connected to the unselected bit lines BL and the selected word line WL and memory cells MC connected to the selected bit line BL and the unselected word lines WL are rapidly applied with a reverse direction voltage of Vd−Δ, hence to prevent mistaken resetting, it is required that Vd−Δ<Vreset.

Figure 16:
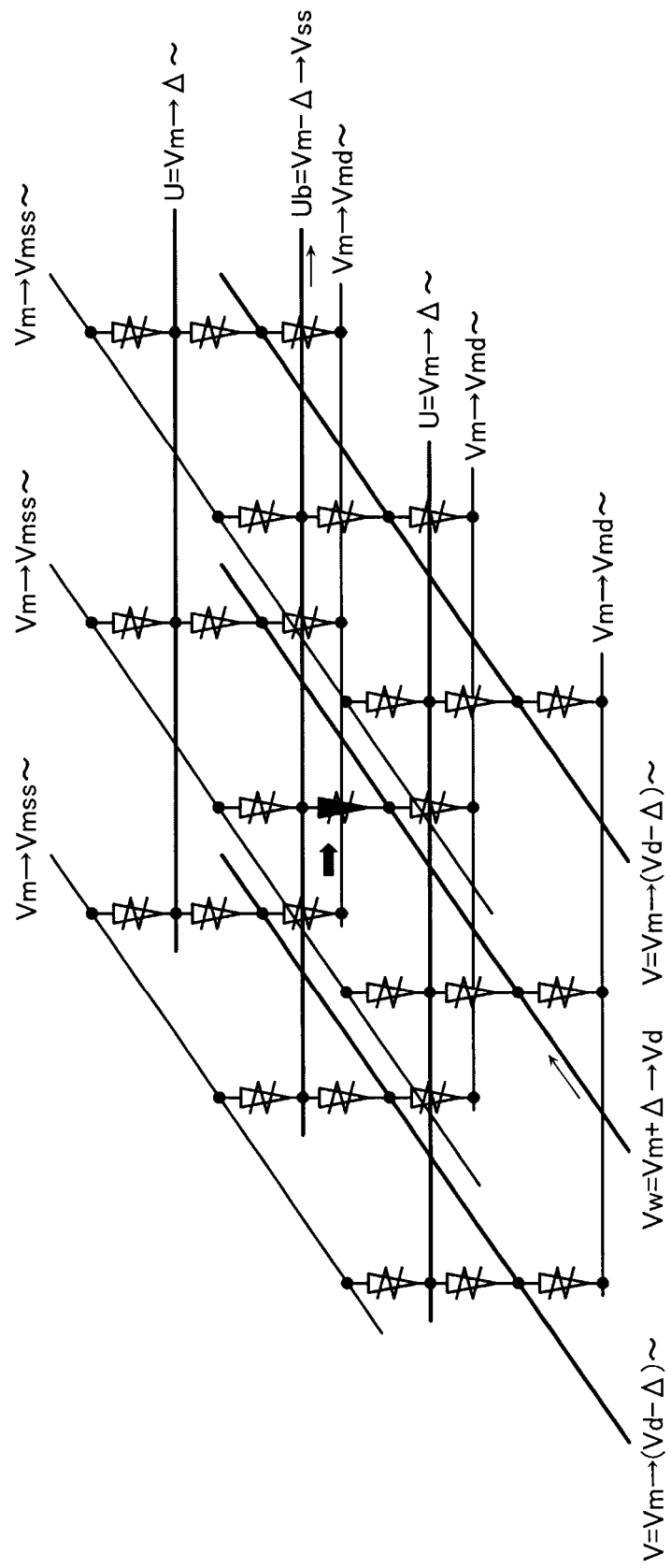
FIG. 16 is a circuit diagram for explaining the resetting operation in same semi conductor memory device.
Figure 17:
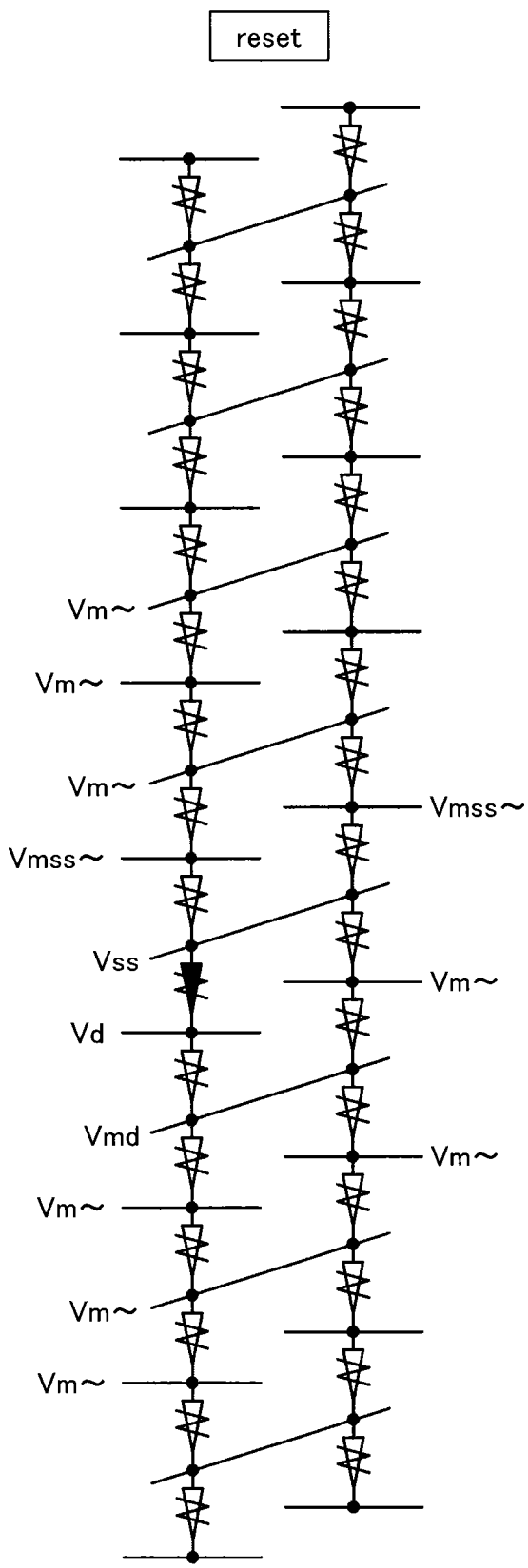
FIG. 17 is a circuit diagram for explaining the resetting operation in same semi conductor memory device.

Then, as shown in FIG. 16, a forward direction bias cell is not connected to the unselected bit lines BL adjacent to the selected bit line BL, hence charging is not performed, and the voltage U of the unselected bit lines BL adjacent to the selected bit line BL is distributed in the voltage Δ~ of about Δ to be in a steady state. Similarly, a forward direction bias cell is also not connected to the unselected word lines WL adjacent to the selected word line WL, hence discharging is not performed, and the voltage V of the unselected word lines WL adjacent to the selected word line BL is distributed in the voltage (Vd−Δ)~ of about Vd−Δ to be in a steady state. In addition, as shown in FIG. 16, a potential of the unselected word lines WL connected to the selected bit line BL via the forward direction bias cell is distributed in Vmss~, and the voltage of the unselected bit lines BL connected to the selected word line WL via the forward direction bias cell is distributed in Vmd~. Therefore, as shown in FIG. 17, in the resetting operation, unselected memory cell mats MM in the three layers above and below the selected memory cell mat MM are affected, but the problem of disturb does not occur. Note that the intermediate voltage Vm and Δ are set to maintain a stable state of such voltages.

[Configuration of Peripheral Circuits]

Next, peripheral circuits of the semiconductor memory device according to the present embodiment are described. In the semiconductor memory device according to the present embodiment, roles of the x lines xL and y lines yL are switched according to the selected memory cell MC. That is, of the x line xL and y line yL connected to a selected memory cell MC, the one connected to the anode of the selected memory cell MC is controlled as the bit line BL, and the one connected to the cathode of the selected memory cell MC is controlled as the word line WL. Therefore, the y line control circuit 2 and the x line control circuit 3 must each function as a bit line control circuit and a word line control circuit, hence are configured similarly.

Figure 18:
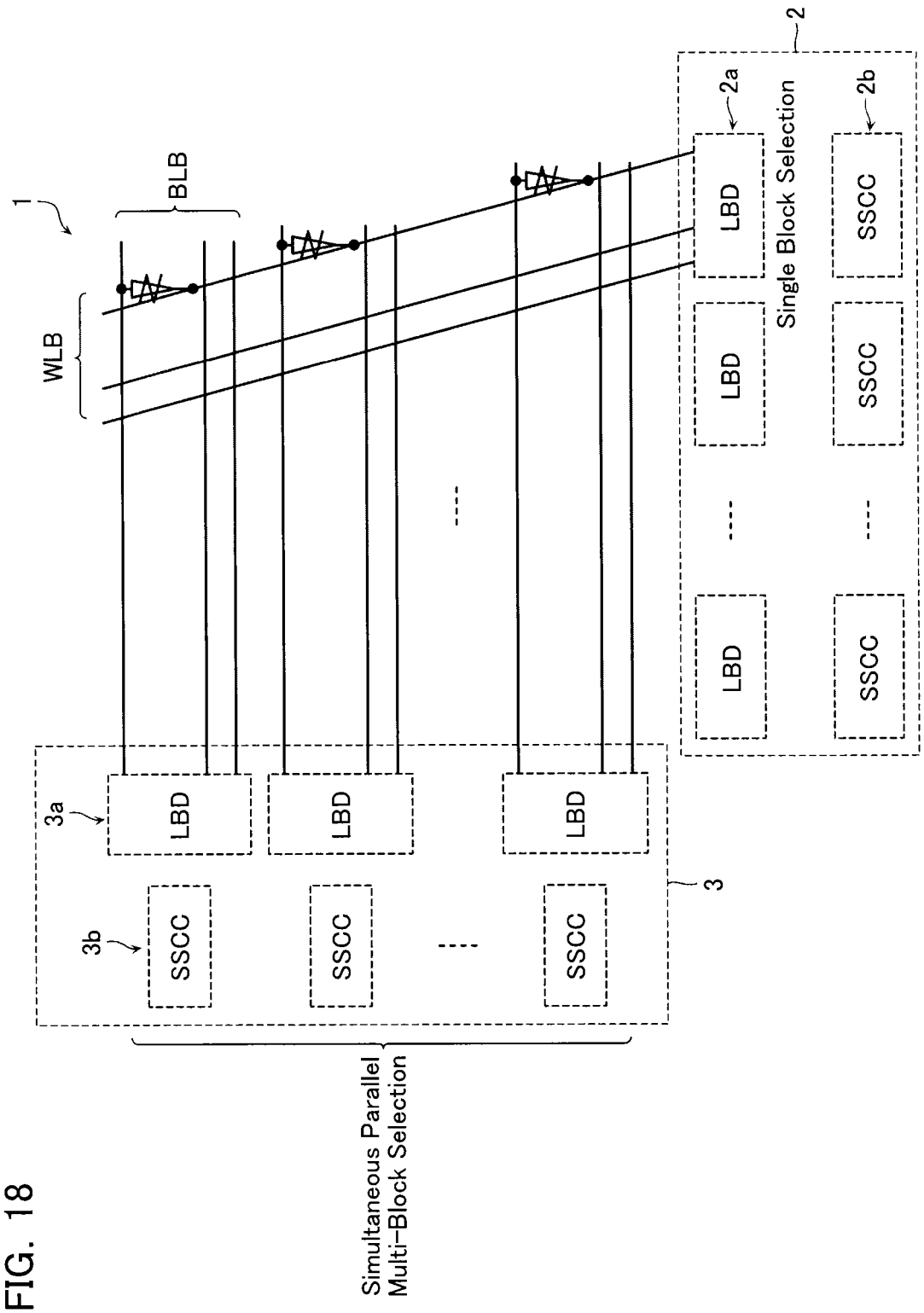
FIG. 18 is a block diagram showing a configuration of peripheral circuits in same semiconductor memory device.

FIG. 18 is a block diagram showing configurations of the y line control circuit 2 and the x line control circuit 3. The y line control circuit 2 and the x line control circuit 3 have a plurality of y lines yL or x lines xL adjacent in a memory cell mat MM grouped to be capable of being simultaneously accessed as a bit line block BLB or a word line block WLB.

The plurality of bit lines BL configuring the bit line block BLB are connected to one of the x line drivers 3a which are provided one to each of the bit line blocks BLB, and one of the plurality of bit lines BL configuring one of the bit line blocks BLB is decode-selected by the x line driver 3a individually provided to the bit line block BLB to be connected to one of the SSCC circuits 3b. In addition, the SSCC circuits 3b simultaneously access the plurality of bit lines BL selected respectively by each of the x line drivers 3a to perform current limitation, voltage change, and so on, individually for each.

Similarly for the word lines WL also, the plurality of word lines WL configuring the word line block WLB are connected to one of the y line drivers 2a which are provided one to each of the word line blocks WLB, and one of the word lines WL is selected to be connected to the SSCC circuit 2b. However, only one of the word line blocks WLB is driven, hence only one of the word lines WL is selected to be applied with a voltage in the SSCC circuit 2b.

[Configuration of y Line Driver 2a and x Line Driver 3a]

Figure 19:
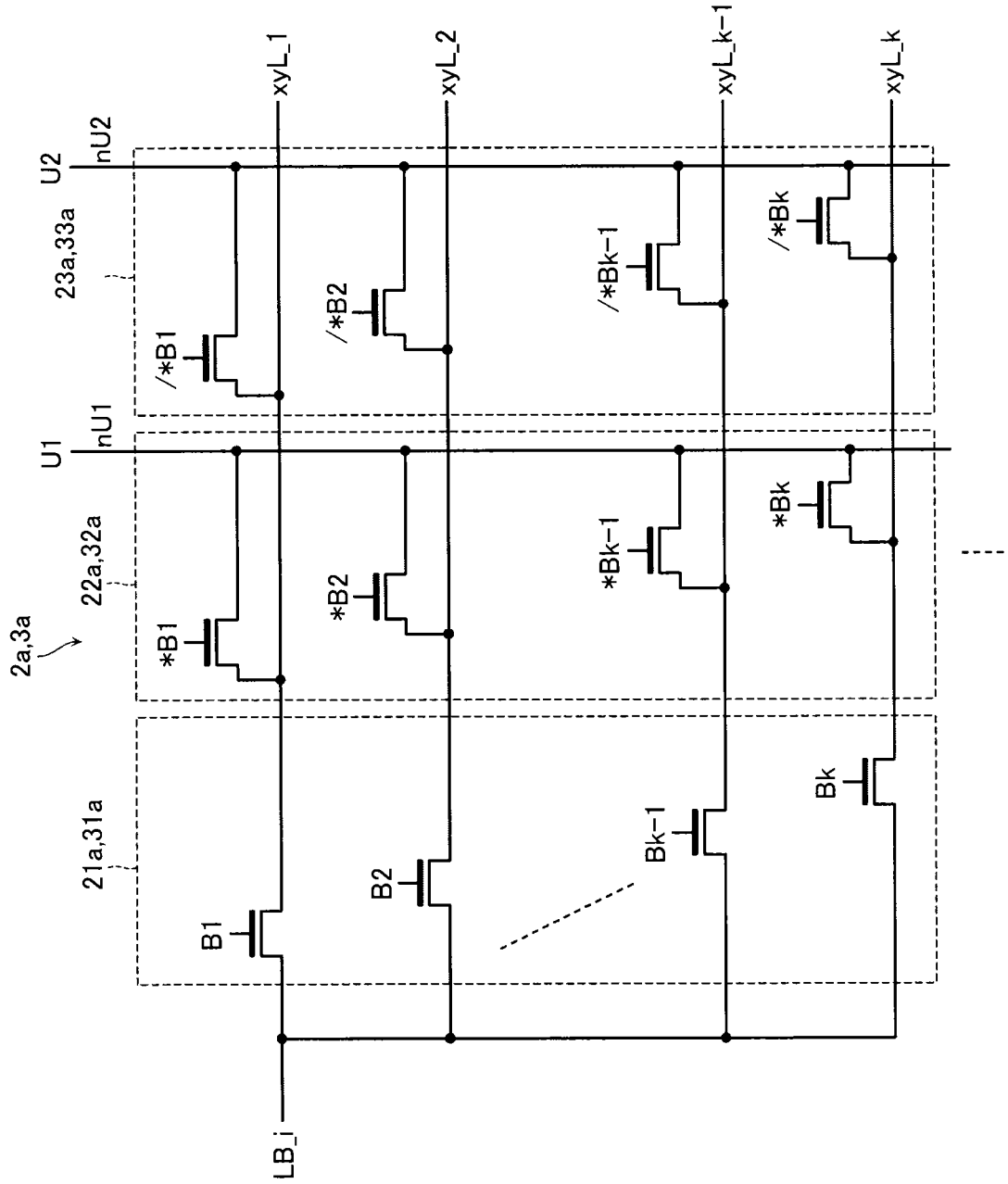
FIG. 19 is a circuit diagram showing an example of configuration of an x line driver and a y line driver in same semiconductor memory device.

FIG. 19 is a block diagram showing an example of configuration of the y line driver 2a and the x line driver 3a. Note that the y line driver 2a and the x line driver 3a are configured similarly, hence hereafter the y line driver 2a and the x line driver 3a are referred to collectively as line driver. Moreover, in FIG. 19, xyL_1~xyL_k represents x line xL_1~xL_k or y line yL_1~yL_k.

Line drivers 2a and 3a comprise: selector units 21a and 31a for selecting one selecting line xyL and connecting the selecting line xyL to an input node LB_i; selected line potential units 22a and 32a for supplying a voltage to the selected selecting line xyL; and unselected line potential units 23a and 33a for supplying a voltage to the unselected selecting line xyL. The selector units 21a and 31a select one of the plurality of bit lines BL or word lines WL (hereafter called "selecting lines xyL") configuring the bit line block BLB or word line block WLB (hereafter called "selected line block") and connect this selected selecting line xyL via an NMOS transistor to the node LB_i. The selected line potential units 22a and 32a connect the selected selecting line xyL and the selected line potential supply node nU1, and supply a selected line potential to the node nU1. The unselected line potential units 23a and 33a connect the unselected selecting line xyL and the unselected line potential supply node nU2, and supply an unselected line potential to the node nU2.

The plurality of NMOS transistors configuring the selected line potential units 22a and 32a have their respective gates inputted with address signals *B1-*Bk, and by having only one of the address signals at "H", connect one of the selecting lines xyL to the selected line potential supply node nU1 to charge the selecting line xyL to the selected line potential U1 in advance.

The plurality of NMOS transistors configuring the unselected line potential units 23a and 33a have their respective gates inputted with address signals /*B1-/*Bk, and by having the address signal corresponding to the selecting lines xyL unselected by the selected line potential units 22a and 32a at "H", charges the unselected selecting line xyL to the unselected line potential U2.

Next, the address signals *B1-*Bk and the address signals /*B1-/*Bk all become "L" and, instead, those of the address signals B1-Bk inputted to gates of the plurality of MOS transistors configuring the selector units 21a and 31a that correspond to the address signals *B1-*Bk selected by the selected line potential units 22a and 32a become "H". As a result, the one selected selecting line xyL is connected to the input node LB_i, and the unselected selecting lines xyL become floating state.

The address signals B1-Bk, the address signals *B1-*Bk, and the address signals /*B1-/*Bk are commonly connected for all of the line drivers 2a and 3a connected to the memory cell array 1. Moreover, a decoder circuit not illustrated is further connected between the line drivers 2a and 3a and the SSCC circuits 2b and 3b, and there is a configuration such that only the selected memory cells MC included in the selected memory cell mat MM are selected.

[Configuration of SSCC Circuits 2b and 3b]

Figure 20:
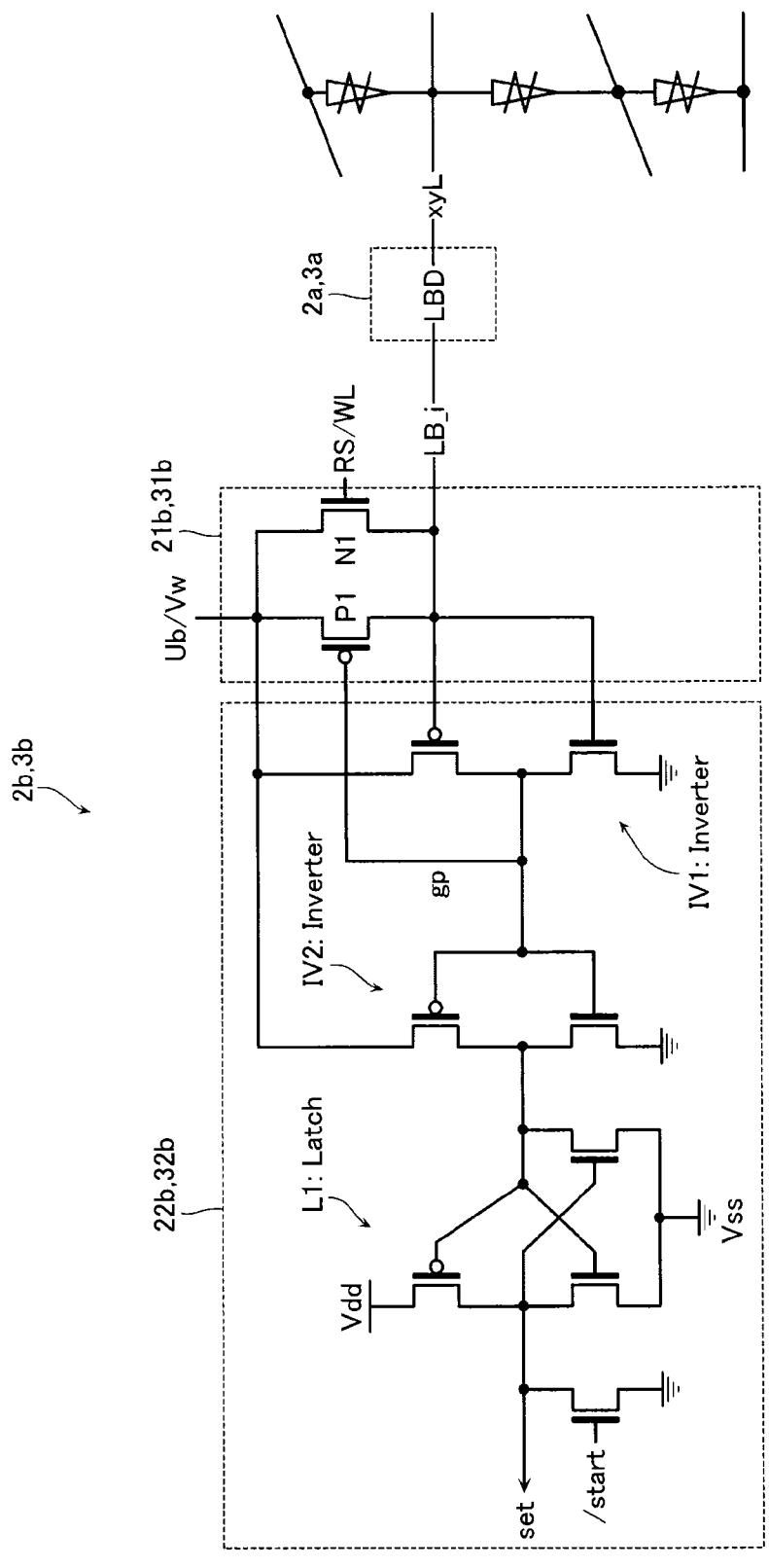
FIG. 20 is a circuit diagram showing an example of configuration of an SSCC circuit in same semiconductor memory device.

Next, a configuration of the SSCC circuits 2b and 3b is described with reference to FIG. 20. The SSCC circuits 2b and 3b comprise: current cutters (CC) 21b and 31b which area portion that cuts inflow of a current to the selecting line xyL; and state sensors (SS) 22b and 32b that control these current cutters 21b and 31b and sense a resistance state of the memory cell MC from a potential level of the bit line BL. The input node LB_i is connected to the current cutters 21b and 31b. The current cutters 21b and 31b apply the selected bit line voltage Ub and the selected word line voltage Vw to the node LB_i according to an operation mode.

An N channel transistor N1 inputted with a control signal RS/WL in the current cutters 21b and 31b is a path used when the SSCC circuits 2b and 3b are connected to the selected bit line BL and the resetting operation is performed, or when the SSCC circuits 2b and 3b are connected to the selected word line WL and the setting operation or read operation is performed. In this case, the control signal RS/WL is always set to "H", the input node LB_i is set to a low potential and current is caused to flow from the selected memory cell MC to the SSCC circuits 2b and 3b. At this time, a PMOS transistor P1 is controlled from the state sensors 22b and 32b to be off. The state sensors 22b and 32b are configured from an inverter IV1 that raises a control signal gp when a level of the input node LB_i has lowered to a certain extent, an inverter IV2 that inverts an output of the inverter IV1, and a latch circuit L1 that latches an output of the inverter IV2. The inverter IV1 is a CMOS inverter that inverts a potential level of the input node LB_i, and its power source is Ub/Vw. An output signal gp of the inverter IV1 is input to a gate of the PMOS transistor P1 of the current cutters 21b and 31b, and controls on/off of the PMOS transistor P1. The latch L1 is a circuit that receives the control signal gp to maintain a state of the input node LB_i. As an initial state, a control signal /start is at "H", and a control signal set is not raised. The latch L1 operates after the control signal /start has become "L", and outputs the state of the control signal gp as the control signal set. The latch L1 uses Ub/Vw as a power source on an input side and a power source Vdd independent of a setting state of a cell as a power source on an output side. As a result, an output of the control signal set is maintained stable.

[Layout]

Next, a layout of the memory cell arrays 1 and the peripheral circuits configured as above is described. FIG. 21 is a plan view showing the layout of the memory cell arrays 1 and the peripheral circuits. In the semiconductor memory device according to the present embodiment, the memory cell arrays 1 are disposed in a matrix, and the x line drivers 3a are disposed on side in the x line xL direction of the memory cell arrays 1, and the y line drivers 2a are disposed on side in the y line yL direction of the memory cell arrays 1. In addition, bus fall & MUXs to be described later are formed at positions in diagonal line directions (positions at an outer side of four corners) of the memory cell arrays 1.

Figure 22:
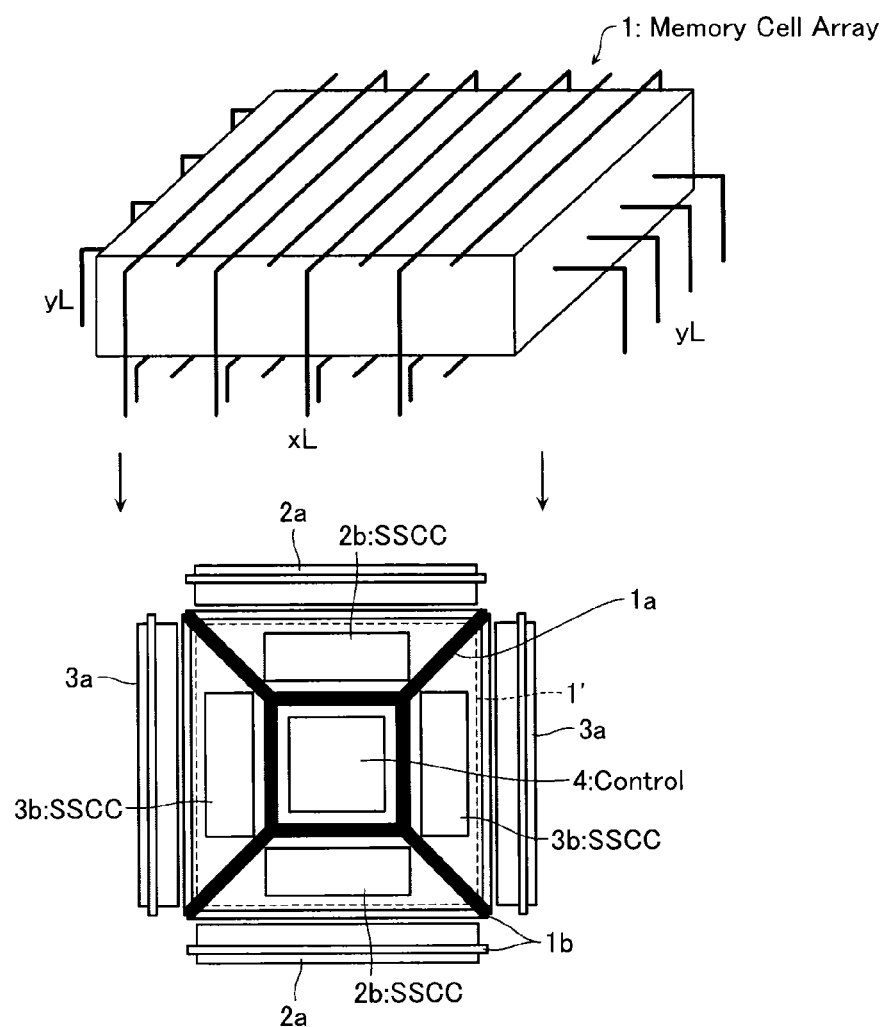
FIG. 22 is a schematic view showing the layout of the memory cell array and peripheral circuits in same semiconductor memory device.

FIG. 22 is a schematic view focusing on one pair of the memory cell array 1 and the peripheral circuits. The x lines xL and the y lines yL are disposed alternately in a height direction and are orthogonal to one another. The x lines xL and the y lines yL both function as the bit lines BL and the word lines WL. Therefore, in order to eliminate a difference in characteristics of the x lines xL and the y lines yL in the present embodiment, the memory cell array 1 is configured as a right-angled parallelepiped having a square base. The x lines xL and y lines yL are each alternately lead out from side surfaces of the memory cell array 1, to be connected to the x line driver 3a and the y line driver 2a. Therefore, in the present embodiment, in order to perform wiring from the y lines yL and the x lines xL of the memory cell array 1 to the peripheral circuits, the four side vicinities of the projection portion 1' of the memory cell array 1 are adopted as vertical wiring regions.

As shown in the drawings, the peripheral circuits for accessing the memory cell array 1 are provided on a substrate below the memory cell array 1. The x lines xL and the y lines yL have an identical function, hence the circuit layout satisfies substantially C4 four-fold rotational symmetry with respect to a center of the memory cell array 1 base. The y line drivers 2a are disposed at positions corresponding to both ends in the y line yL direction of the memory cell array 1, and the x line drivers 3a are disposed at positions corresponding to both ends in the x line xL direction of the memory cell array 1. A control circuit 4 for drive-controlling the peripheral circuits is disposed at a center of the projection portion 1' of the memory cell array 1, and the SSCC circuits 2b and 3b are disposed between the control circuit 4 and the y line driver 2a and x line driver 3a. In addition, formed in the four sides of the control circuit 4 is a bus 1a for transmitting and receiving control signals from external to the control circuit 4, control signals between the control circuit 4 and the SSCC circuits 2b and 3b, data, and so on. The bus 1a is formed in the projection portion 1' of the memory cell array 1, and vertical lines of the x and y lines xL and yL are formed at the four sides of the projection portion 1' of the memory cell array 1. Therefore, the bus 1a extends in diagonal directions of the memory cell array 1 for input/output of signals with external. Moreover, a bus 1b is connected to each of the y line drivers 2a and x line drivers 3a. An address bus (the address signal lines B1-Bk, and so on), a data bus, and so on are included in the bus 1b for each memory cell mat MM.

[Layout of x and y Line Drivers 2a and 3a]

Figure 23:
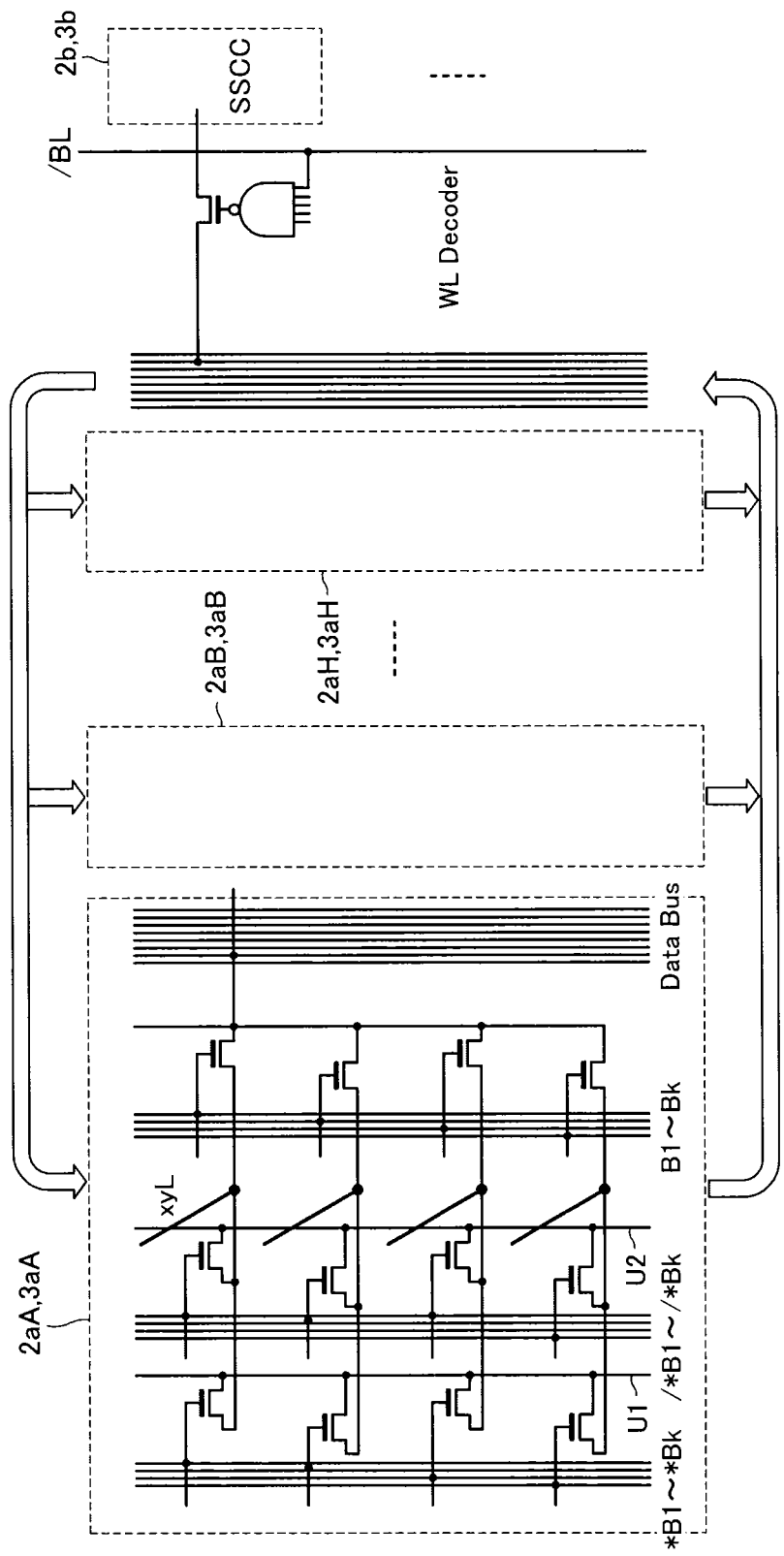
FIG. 23 is a block diagram showing an example of layout of the x line driver and the y line driver in same semiconductor memory device.
Figure 24:
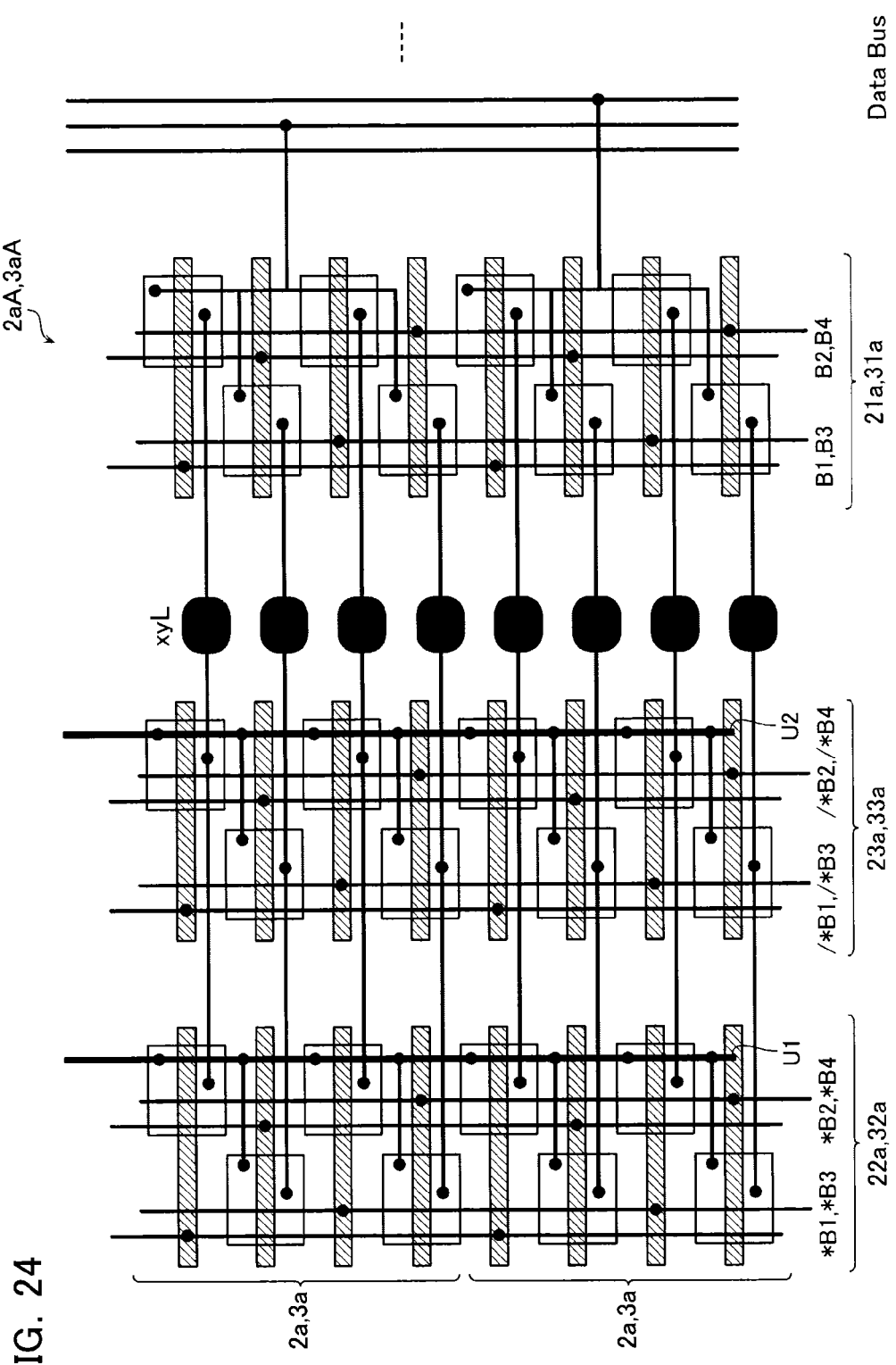
FIG. 24 is a block diagram showing an example of layout of the x line driver and the y line driver in same semiconductor memory device.

Next, a layout of x and y line drivers 2a and 3a is described. FIG. 23 is a block diagram showing an example of layout of the x and y line drivers 2a and 3a, and FIG. 24 is a plan view of same example of layout. For example, when the memory cell array 1 is configured from 16 layers of memory cell mats MM, eight or nine pairs of the plurality of x and y line drivers 2a and 3a such as described in FIG. 18 are required. In order to simplify explanation, there are considered to be eight pairs of the x and y line drivers 2a and 3a, and if these eight pairs of the x and y line drivers 2a and 3a are assumed to be respectively 2aA-2aH and 3aA-3aH, then the x and y line drivers 2aA and 3aA connected to the memory mat MM in an uppermost layer are disposed at a position furthest from the memory cell array 1, and the x and y line drivers 2aH and 3aH connected to the memory mat MM in a lowermost layer are disposed at a position nearest to the memory cell array 1.

Data lines configuring the data bus transmit data from each of the selected line blocks BLB and WLB, and are connected to respective SSCC circuits 2b and 3b. When the selecting lines xyL function as the bit lines BL, connection to the SSCC circuits 2b and 3b is parallel data transfer, hence is activated simultaneously, but when the selecting lines xyL function as the word lines WL, one line is selected, hence a WL decoder (FIG. 23) acting as a decoder is provided to perform the selection. This decoder is inputted with an address signal /BL, and is configured such that when the selecting lines xyL operate as the bit lines BL, /BL is set to "L" and output of a NAND logic gate of the decoder is set to "H" whereby all of the SSCC circuits 2b or 3b and selecting lines xyL are linked.

[Layout of Bus Fall & MUX]

Figure 25:
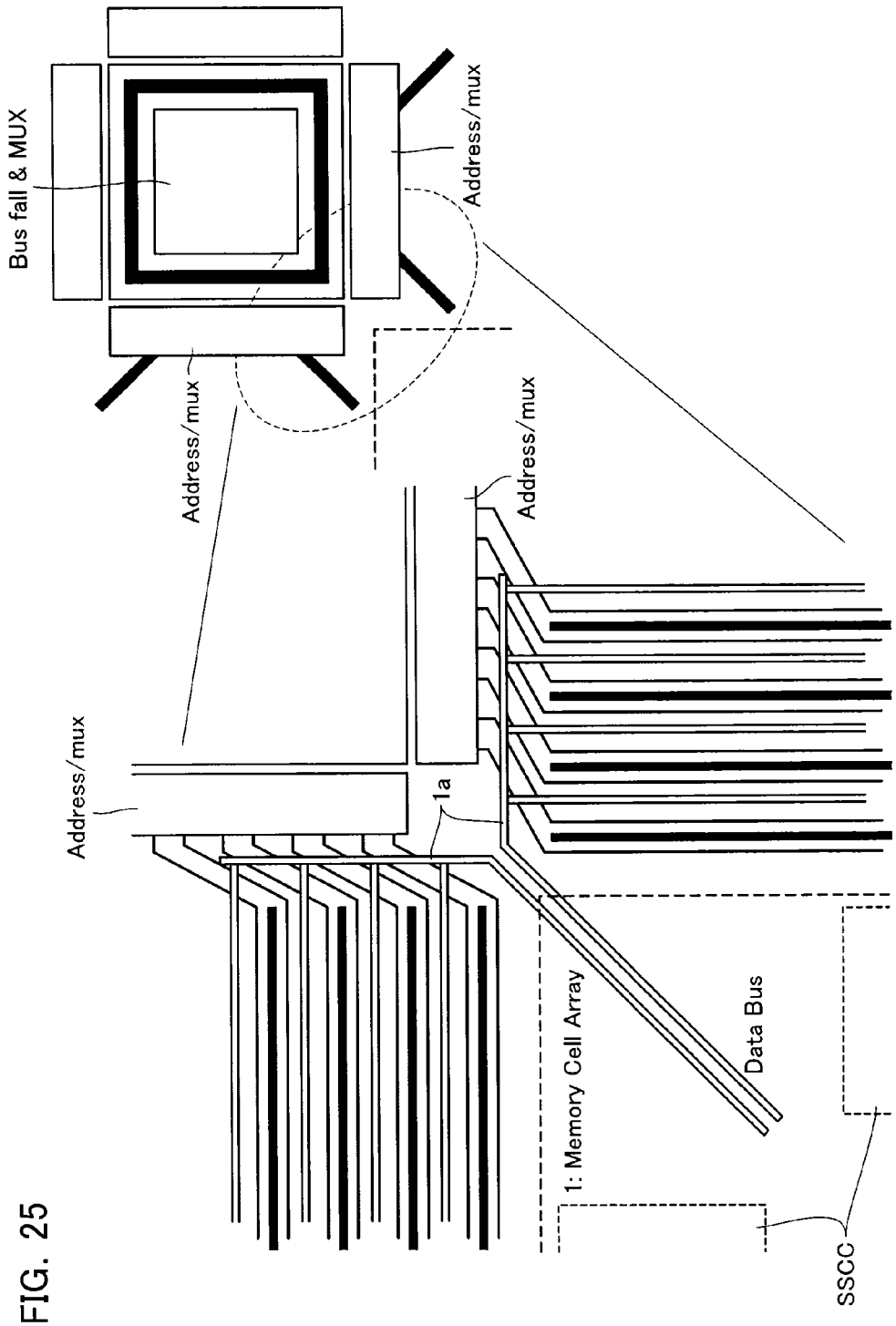
FIG. 25 is a plan view showing an example of layout of a bus fall & MUX in same semiconductor memory device.

FIG. 25 is a plan view showing an example of layout of the bus fall & MUXs. The bus fall & MUXs are portions that drop addresses, data, and various kinds of control signals from the memory cell array 1 to the bus in the substrate. In addition, the bus fall & MUXs include on their four sides a decode circuit Address/mux and perform input/output of address signals via the decode circuit Address/mux.

In the present embodiment, two or more of the memory cell mats MM are never simultaneously accessed, hence the data buses of each of the memory cell mats MM are connected to a bus 1a in a shared manner. On the other hand, the address buses of B1-Bk and so on are lead out independently from the x line drivers and y line drivers in each of the individual memory cell mats MM, to be connected to the decode circuit Address/mux via a 45° wiring portion in which the address bus is bent 45° to perform wiring.

Figure 26A:
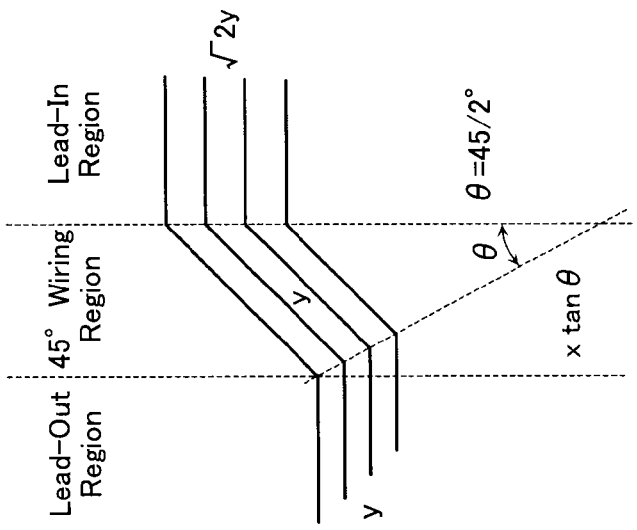
FIGS. 26A to 26C are schematic views for explaining a method of 45° wiring in same semiconductor memory device.
Figure 26B:
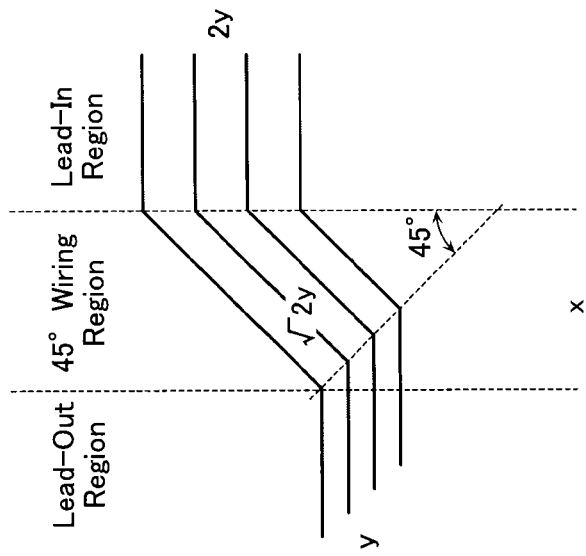
Figure 26C:
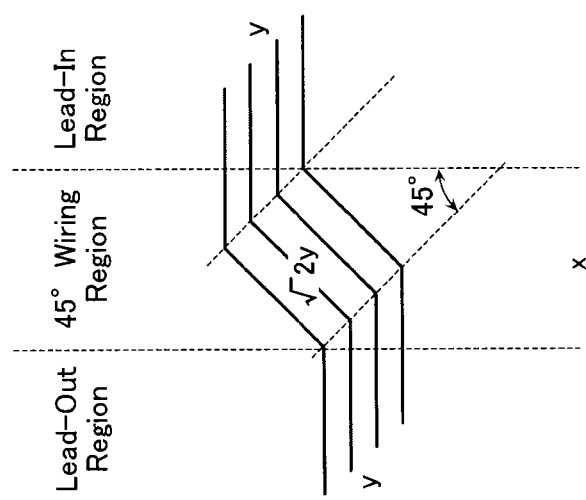

FIG. 26A to 26C are schematic views for explaining a method of the 45° wiring. In FIG. 26A to 26C, lead-out regions are portions of the address bus lead out from the x and y line drivers 2a and 3a before being bent 45°, 45° wiring regions are portions of the address bus bent 45°, and lead-in regions are portions where the address bus is further bent 45° from the 45° wiring region to be returned to a direction parallel to the lead-out region. In addition, a pitch of address lines in the lead-out region is assumed to be Py. Moreover, an angle formed by a straight line traversing a boundary between the lead-out region and the 45° wiring region of each of the address lines and a straight line perpendicular to the address bus is called a lead-out angle, and an angle formed by a straight line traversing a boundary between the 45° wiring region and the lead-in region of each of the address lines and a straight line perpendicular to the address bus is called a lead-in angle.

FIG. 26A to 26C show three patterns of methods of the 45° wiring. In FIG. 26A, the lead-out angle and the lead-in angle are both 45°, and the pitch of the address lines is √2y in the 45° wiring region and y in the lead-in region. Such a 45° wiring method is effective when the address bus itself is displaced.

However, when the address bus is lead into the decode circuit Address/mux, there is no need to suppress the pitch of address signals in the lead-in region to y, and a configuration such as in FIG. 26B may be adopted. In FIG. 26B, the lead-out angle is 45° and the lead-in angle is 0°. Moreover, the pitch of the address lines is √2y in the 45° wiring region and 2y in the lead-in region.

In the present embodiment, the above-described methods of the 45° wiring are further developed to reduce area of the 45° wiring region and thereby reduce circuit area. In the present embodiment, as shown in FIG. 26C, the lead-out angle is 45/2° and the lead-in angle is 0°. Moreover, the pitch of the address lines is y in the 45° wiring region and √2y in the lead-in region.

Second Embodiment

Figure 27:
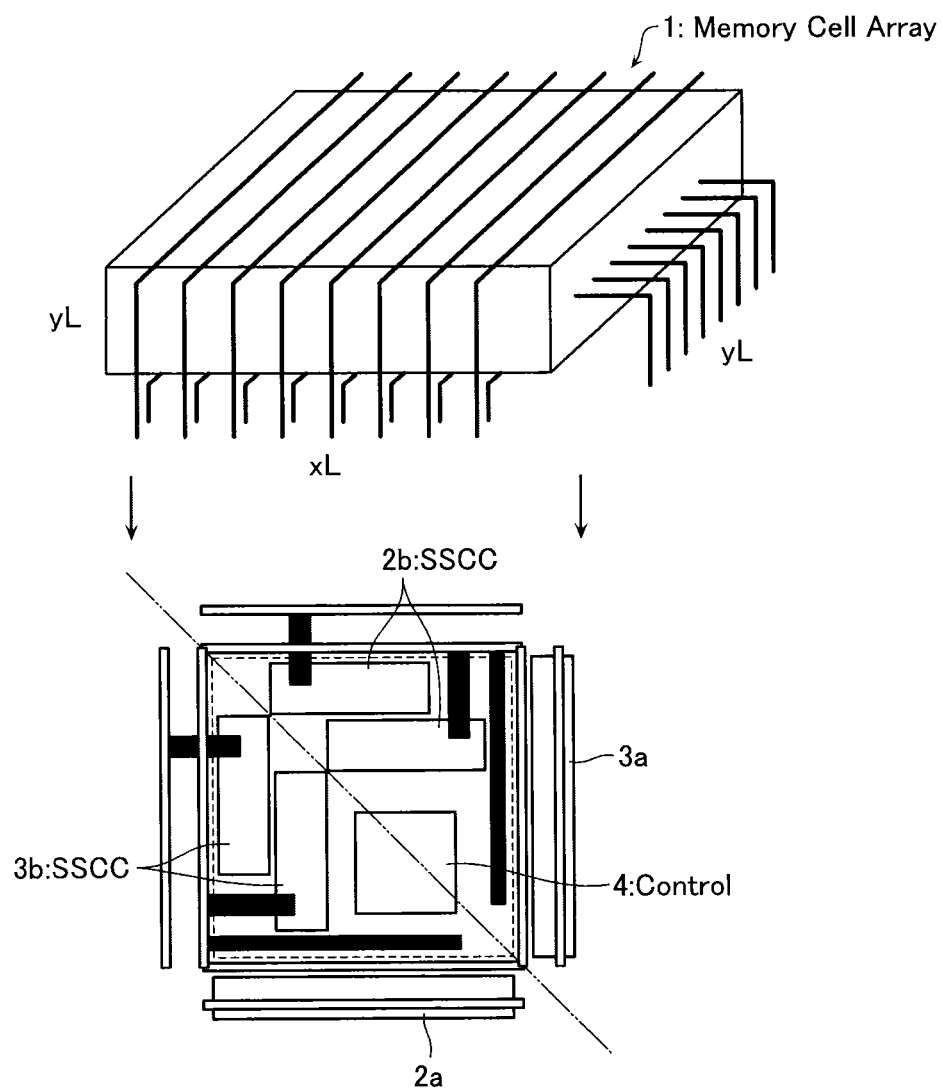
FIG. 27 is a plan view showing a layout of a memory cell array and peripheral circuits in a semiconductor memory device according to a second embodiment.
Figure 28:
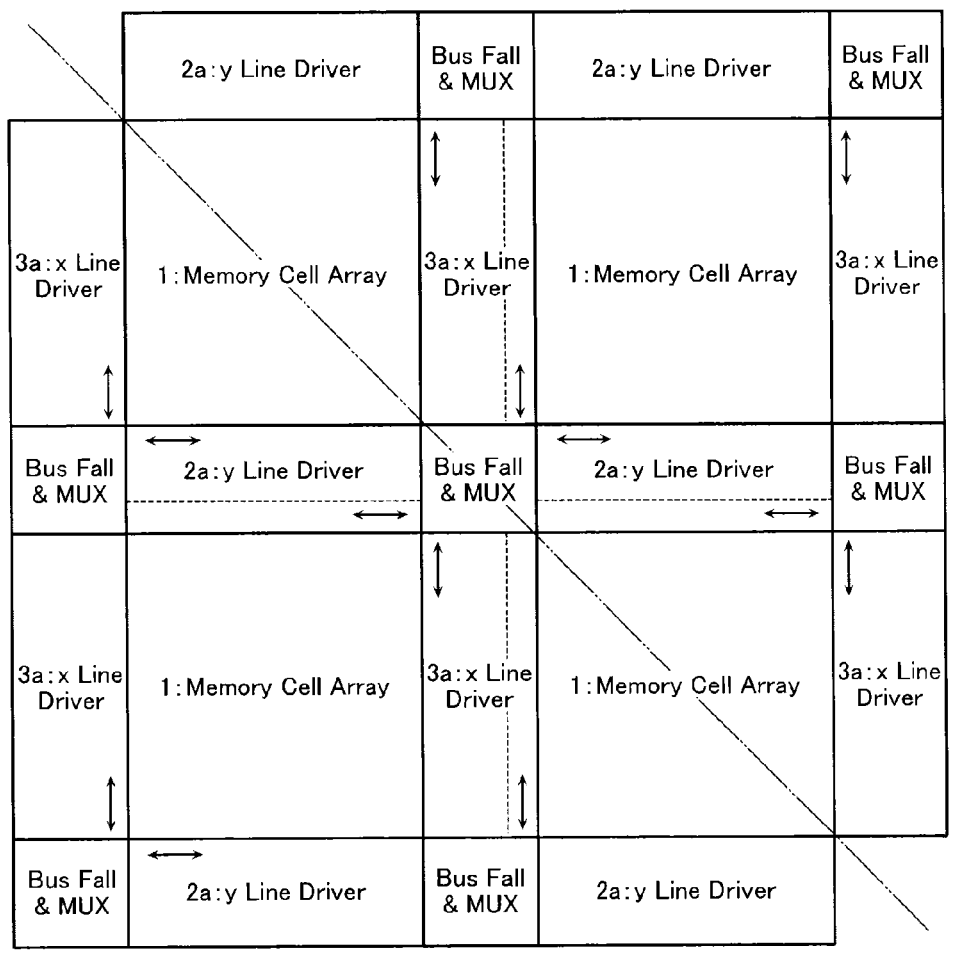
FIG. 28 is a plan view showing the layout of the memory cell array and peripheral circuits in same semiconductor memory device.

Next, a semiconductor memory device according to a second embodiment is described. The semiconductor memory device according to the second embodiment is basically similar to the semiconductor memory device according to the first embodiment, but differs in method of contact to the memory cell array 1 and in layout pattern of the peripheral circuits. That is, whereas in the first embodiment, the x lines xL and y lines yL were each alternately lead out from both side walls of the memory cell array 1 to be connected to the four sides of the projection region 1' of the memory cell array 1, in the present embodiment, as shown in FIG. 27, the x lines xL and y lines yL are each lead out from one surface of the memory cell array 1 to be connected to two adjacent sides of the projection region 1' of the memory cell array 1. In addition, in the present embodiment, the peripheral circuits are laid out symmetrically, that is, with substantially bilateral symmetry D1 with respect to a diagonal line (dashed-two dotted line in the drawings) of the memory cell array 1. Furthermore, as shown in FIG. 28, the bus fall & MUXs are disposed in parallel to the diagonal line of the memory cell array 1. In the present embodiment, the 45° wiring region can be reduced, hence degree of freedom of the layout increases.

Third Embodiment

Figure 29:
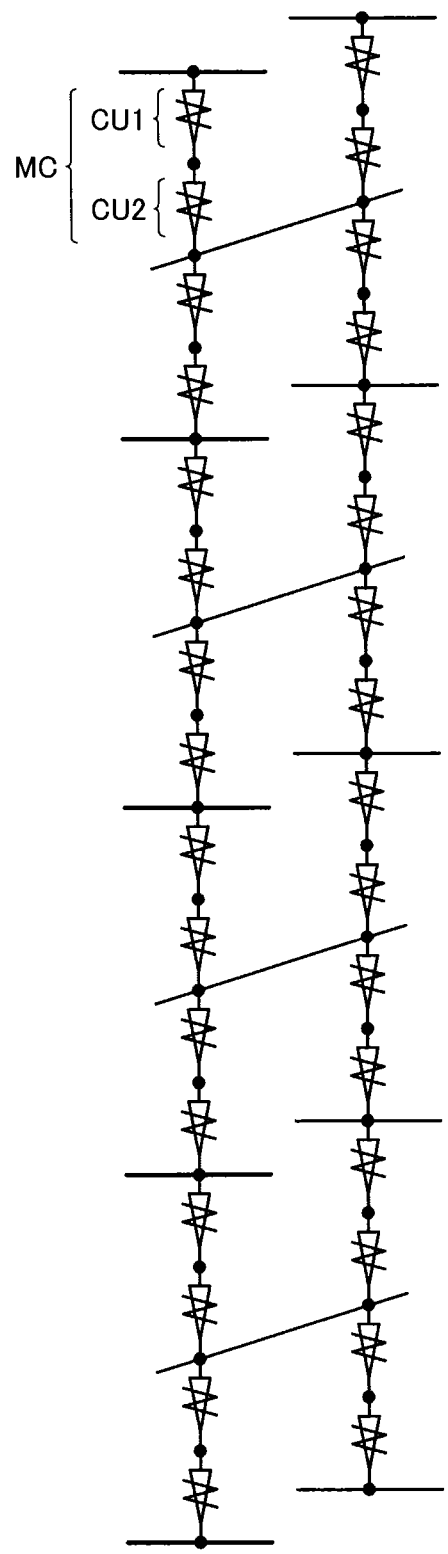
FIG. 29 is a circuit diagram showing a configuration of a memory cell array in a semiconductor memory device according to a third embodiment.

Next, a semiconductor memory device according to a third embodiment is described. The semiconductor memory device according to the present embodiment is basically similar to those of the first and second embodiments, but in the present embodiment, as shown in FIG. 29, two cell units CU in the first and second embodiments are stacked in tandem to configure one memory cell MC to be used as a three-level memory cell MC. The memory cell MC having two of the cell units CU in the first and second embodiments stacked in tandem is hereafter called a "tandem cell", and a definition of multilevel states, transition of states, and so on, of this memory cell MC are now described with reference to FIG. 30.

First, regarding the definition of states of the memory cell MC, the case where both the cell units CU1 and CU2 configuring the tandem cell are in a reset state is assumed to be a '2' state, the case where only one of the cell units CU1 and CU2 is in a reset state is assumed to be a '1' state, and the case where neither of the cell units CU1 and CU2 is in a reset state is assumed to be a '0' state. This allows the tandem cell to be set to three states, hence this memory cell MC is a three-level cell.

Next, it is described how the tandem cell causes retention characteristics to be significantly improved. The cell units CU1 and CU2 have a set state (S), which is a quasi-stable state, where electrodes are linked by a conductive material to cause low-resistance, and, by diffusion of the conductive material due to electrical, thermal, or some other kind of disturbance, the cell units CU1 and CU2 pass through a weak reset state (WR) to presently attain a reset state (R). In the reset state, a stable state is formed, in which metal ions are sparsely diffused in amorphous silicon layers 12 and 22, and a small amount of disturbance does not result in transition to a low-resistance state.

Figure 30:
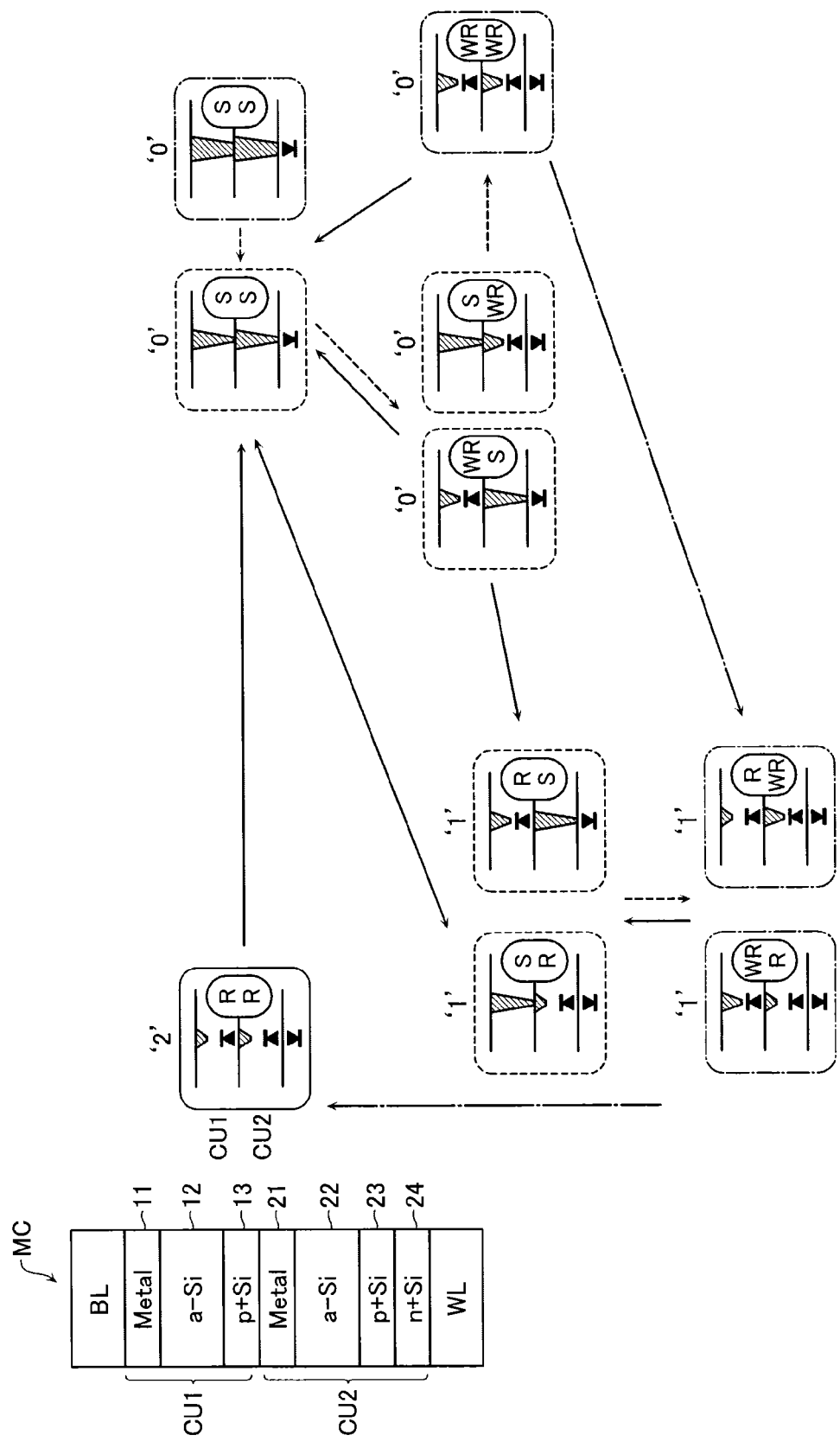
FIG. 30 is a schematic view for explaining a state transition in same semiconductor memory device.

Accordingly, a process causing a selected memory cell MC to undergo transition to a certain state and a spontaneous and natural relaxation process of the memory cell MC are as shown in FIG. 30. That is, the '2' state of the memory cell MC surrounded by the solid line is an erase state and also a stable state, and this state can be maintained in an almost nonvolatile manner in reaction to a certain amount of disturbance. On the other hand, of quasi-stable states where there is a possibility of a state changing due to natural relaxation, the memory cells MC surrounded by a broken line frame in the drawing are comparatively easily state-changeable. The memory cells MC in this state have at least one of the cell units CU1 and CU2 in a set state. It is easy for the set state to change to the weak reset state. Moreover, those of the quasi-stable states that are comparatively stable and can maintain their states provided there is no disturbance are shown surrounded by a dashed-dotted line frame in the drawing. Those of S/S states where the filament is strongly formed, and each of states of WR/WR, R/WR, and WR/R correspond to this quasi-stable state. These states are for cases where the cell units CU1 and CU2 are in a strong set state or weak reset state only, or are combinations of a reset state and weak reset state. These quasi-stable states allow the state to be maintained provided there is no disturbance.

Those of the quasi-stable states that are a strong set state, when subject to disturbance, undergo transition to a set state, and the set state further undergoes transition to the weak reset state. The weak reset state after transition is a high-resistance state enabling easy shifting back and forth with the set state. Furthermore, the weak reset state presently undergoes transition to the reset state to stabilize as a state where the set state cannot be returned to. As a relaxation process, it is extremely easy for the set state to relax to the weak reset state, and the weak reset state is thought to relax to the reset state when the disturbance is rather large.

Regarding the above points, the processes causing state transition by a potential setting of the selected memory cell MC only are indicated by the solid line arrows, state transitions in those of processes of temporal natural relaxation where it is easy for relaxation to occur are indicated by broken line arrows, and state transitions where it is difficult for relaxation to occur are indicated by dashed-dotted line arrows. The R/R state can be caused to undergo transition to the S/S state by potential setting. Transition between the S/S state and the S/R or R/S states can be easily performed by potential setting. WR/S and S/WR arising due to a relaxation process from the S/S state can be easily caused to undergo transition to the S/S state, S/R state or R/S state by potential setting. The WR/WR state which is a quasi-stable state where relaxation has further advanced from the WR/S or S/WR states can be easily caused to undergo transition to the S/S state by potential setting. The WR/R or R/WR states which are quasi-stable states where relaxation has further advanced from the S/R or R/S states can be easily caused to undergo transition to the S/R or R/S states by potential setting.

Since relaxation from the S/S quasi-stable state to the WR/WR state occurs via the S/WR or WR/S states, the relaxation from this quasi-stable state to a stable state takes longer than in a single cell unit CU. Furthermore, it is comparatively difficult for relaxation from the WR/WR state where one of the cell units CU attains the R state to occur, hence the cell remains in a '0' state for a long time. The WR/R or R/WR quasi-stable states are states where one of the cell units CU is already in a reset state, that is, a high-resistance state, hence a probability of transmitting a large electrical disturbance to the cell unit in the WR state is reduced. Hence, it is difficult for relaxation from the WR/R state or R/WR state to the R/R state to occur.

As indicated above, retention characteristics of the tandem cell are improved dramatically compared to characteristics of a single cell unit CU. However, if an ECC allowing easier correction is further provided to handle retention defects in '0' state or '1' state, a memory system favorable for retention can be constructed.

As indicated above, in the above-described embodiment, by adopting a configuration where the memory cell MC has a tandem cell configuration to achieve three levels thereby improving retention characteristics, moreover by having data as a pair cell stored as code thereby enabling error correction, a nonvolatile large capacity memory having further improved retention characteristics can be constructed. Including the ECC to thereby store 4 bit binary data by 8 cells of four symbols of $Z_5$ and enable correction of an error in one symbol results in 25% error handling being made possible. As a result, information density in the memory cell array 1 is lowered, but retention reliability of data improves dramatically. If the ECC system is relaxed and a configuration adopted to store 8 bit binary data by 12 cells of six symbols using $Z_7$ and enable correction of an error in one symbol, 12.5% error handling is possible and information density of the memory cell array 1 improves by two times.

On the other hand, if retention characteristics of the memory cell MC are improved and the ECC becomes unnecessary, 3 bit binary data can be stored by 2 cells of two symbols of $Z_3$, hence information density of memory can be increased by as much as three times from 1 bit/2 cells to 1 bit/0.7 cells. Furthermore, merely by including a metal wiring processing, density of memory cells MC can be doubled as binary cells, and also regarding access, direct data retention not requiring conversion of number system is enabled, whereby a function close to random memory can be provided.

As the above makes clear, this embodiment allows provision of a three-dimensional resistance varying memory of small power consumption and suitable for a large capacity file memory having good data retention characteristics.

FIGS. 31A and 31B are cross-sectional views showing a difference in stacking structure between the first and second embodiments and the third embodiment. The semiconductor memory device according to the third embodiment shown in FIG. 31B has manufacturing processes basically similar to those of the semiconductor memory devices according to the first and second embodiments shown in FIG. 31A, and the memory cell array 1 according to the present embodiment can be manufactured simply by omitting the insertion processes (A in FIG. 31A) of the x lines xL or y lines yL and the n+Si layer, and so on, between the memory cells MC. In addition, sequences for write or read differ, hence configuration, operation, and so on, of the peripheral circuits must be changed, but depending on design, these different sequences for write or read may also be handled simply by logic of the controlling state machine, without changing the layout.

[Summary]

Summarizing the above, the above-described embodiments are as follows.

(1) A semiconductor memory device, comprising:

a memory cell array configured having a plurality of memory cell mats stacked therein, each of the memory cell mats including a plurality of first lines, a plurality of second lines intersecting the first lines, and a plurality of memory cells connected to the first lines and the second lines, and the memory cell mats being stacked such that the first lines and the second lines are shared alternately by each of the memory cell mats; and a peripheral circuit for applying a voltage to the memory cell array, each of the memory cells having a variable resistance characteristic and a current rectifying characteristic, and adopting one end as an anode and the other end as a cathode according to the current rectifying characteristic, an orientation from the anode toward the cathode of all the memory cells in the memory cell array being identical, and the peripheral circuit, during setting, resetting, and read operations of a selected memory cell, adopting one of the first line and the second line connected to an anode side of the selected memory cell as a selected bit line, and applying to the selected bit line a selected bit line voltage which is a voltage on the anode side required in the setting, resetting, and read operations, and adopting the other of the first line and the second line connected to a cathode side of the selected memory cell as a selected word line, and applying to the selected word line a selected word line voltage which is a voltage on the cathode side required in the setting, resetting, and read operations.

(2) The semiconductor memory device according to (1), wherein during the setting, resetting, and read operations of the selected memory cell, the peripheral circuit sets the first lines and the second lines connected to unselected memory cells of the memory cell array to a floating state.

(3) The semiconductor memory device according to (1) or (2), wherein the peripheral circuit includes a first line control circuit for applying a voltage to the first lines and a second line control circuit for applying a voltage to the second lines, the first line control circuit, when the first line is the selected bit line, applies the selected bit line voltage to the first line and detects a voltage state of the first line to control application of the selected bit line voltage to the first line, and, when the first line is the selected word line, applies the selected word line voltage to the first line, and the second line control circuit, when the second line is the selected bit line, applies the selected bit line voltage to the second line and detects a voltage state of the second line to control application of the selected bit line voltage to the second line, and, when the second line is the selected word line, applies the selected word line voltage to the second line.

(4) The semiconductor memory device according to (3), wherein the memory cell array has a substantially square underside, and the first line control circuit and the second line control circuit are disposed underneath the memory cell array and are disposed symmetrically in four regions partitioned by two diagonal lines of the memory cell array underside.

(5) The semiconductor memory device according to (3), wherein the memory cell array has a substantially square underside, and the first line control circuit and the second line control circuit are disposed underneath the memory cell array and are disposed symmetrically in two regions partitioned by one diagonal line of the memory cell array underside.

(6) The semiconductor memory device according to (1), wherein the peripheral circuit comprises:

a bus formed along a periphery of an underside of the memory cell array; and a decode circuit disposed on an outer side of four corners of the underside of the memory cell array, the peripheral circuit has a 45° wiring region between a lead-out region from the bus and a lead-in region to the decode circuit, a bus of the lead-out region and a bus of the lead-in region are parallel, and an angle formed by a bus of the 45° wiring region and the buses of the lead-out region and the lead-in region is 45°, and an angle formed by a direction of alignment of each of wiring connection points of the bus of the lead-out region and the bus of the 45° wiring region and a direction of alignment of each of wiring connection points of the bus of the 45° wiring region and the bus of the lead-in region is 45°/2.

(7) The semiconductor memory device according to (1), wherein the setting operation is performed by applying a setting voltage to the selected memory cell in a forward direction from the anode to the cathode to set the memory cell to a low-resistance state, the resetting operation is performed by applying a resetting voltage to the selected memory cell in a reverse direction from the cathode to the anode to set the memory cell to a high-resistance state, and the setting voltage is not more than a sum of a voltage that is two times a dead-band voltage and the resetting voltage, the dead-band voltage being a maximum voltage at which a current does not flow when a voltage is applied to the memory cell in the forward direction from the anode to the cathode.

(8) The semiconductor memory device according to (7), wherein prior to the setting operation of the selected memory cell, an intermediate voltage Vm1 is applied to the selected bit line and the selected word line, a voltage larger than the intermediate voltage Vm1 is applied to unselected word lines arranged in an identical wiring layer to the selected word line, and to a plurality of unselected bit lines and unselected word lines arranged more on a cathode side of the memory cell than the selected word line, and a voltage smaller than the intermediate voltage Vm1 is applied to unselected bit lines arranged in an identical wiring layer to the selected bit line, and to a plurality of unselected bit lines and unselected word lines arranged more on an anode side of the memory cell than the selected bit line.

(9) The semiconductor memory device according to (7) or (8), wherein prior to the resetting operation of the selected memory cell, an intermediate voltage Vm2 is applied to the unselected bit lines and the unselected word lines, a voltage higher than the intermediate voltage Vm2 is applied to the selected word line, and a voltage lower than the intermediate voltage Vm2 is applied to the selected bit line.

[Other]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array configured having a plurality of memory cell mats stacked therein, each of the memory cell mats including a plurality of first lines, a plurality of second lines intersecting the first lines, and a plurality of memory cells connected to the first lines and the second lines, and the memory cell mats being stacked such that the first lines and the second lines are shared alternately by each of the memory cell mats; and
a peripheral circuit for applying a voltage to the memory cell array,
each of the memory cells having a variable resistance characteristic and a current rectifying characteristic, and adopting one end as an anode and the other end as a cathode according to the current rectifying characteristic,
an orientation from the anode toward the cathode of all the memory cells in the memory cell array being identical, and
the peripheral circuit, during setting, resetting, and read operations of a selected memory cell, adopting one of the first line and the second line connected to an anode side of the selected memory cell as a selected bit line, and applying to the selected bit line a selected bit line voltage which is a voltage on the anode side required in the setting, resetting, and read operations, and adopting the other of the first line and the second line connected to a cathode side of the selected memory cell as a selected word line, and applying to the selected word line a selected word line voltage which is a voltage on the cathode side required in the setting, resetting, and read operations.

2. The semiconductor memory device according to claim 1, wherein during the setting, resetting, and read operations of the selected memory cell, the peripheral circuit sets the first lines and the second lines connected to unselected memory cells of the memory cell array to a floating state.

3. The semiconductor memory device according to claim 1, wherein the peripheral circuit includes a first line control circuit for applying a voltage to the first lines and a second line control circuit for applying a voltage to the second lines, the first line control circuit, when the first line is the selected bit line, applies the selected bit line voltage to the first line and detects a voltage state of the first line to control application of the selected bit line voltage to the first line, and, when the first line is the selected word line, applies the selected word line voltage to the first line, and the second line control circuit, when the second line is the selected bit line, applies the selected bit line voltage to the second line and detects a voltage state of the second line to control application of the selected bit line voltage to the second line, and, when the second line is the selected word line, applies the selected word line voltage to the second line.

4. The semiconductor memory device according to claim 3, wherein the memory cell array has a substantially square underside, and the first line control circuit and the second line control circuit are disposed underneath the memory cell array and are disposed symmetrically in four regions partitioned by two diagonal lines of the memory cell array underside.

5. The semiconductor memory device according to claim 3, wherein the memory cell array has a substantially square underside, and the first line control circuit and the second line control circuit are disposed underneath the memory cell array and are disposed symmetrically in two regions partitioned by one diagonal line of the memory cell array underside.

6. The semiconductor memory device according to claim 1, wherein the peripheral circuit comprises:

a bus formed along a periphery of an underside of the memory cell array; and a decode circuit disposed on an outer side of four corners of the underside of the memory cell array, the peripheral circuit has a 45° wiring region between a lead-out region from the bus and a lead-in region to the decode circuit, a bus of the lead-out region and a bus of the lead-in region are parallel, and an angle formed by a bus of the 45° wiring region and the buses of the lead-out region and the lead-in region is 45°, and an angle formed by a direction of alignment of each of wiring connection points of the bus of the lead-out region and the bus of the 45° wiring region and a direction of alignment of each of wiring connection points of the bus of the 45° wiring region and the bus of the lead-in region is 45°/2.

7. The semiconductor memory device according to claim 1, wherein the setting operation is performed by applying a setting voltage to the selected memory cell in a forward direction from the anode to the cathode to set the memory cell to a low-resistance state, the resetting operation is performed by applying a resetting voltage to the selected memory cell in a reverse direction from the cathode to the anode to set the memory cell to a high-resistance state, and the setting voltage is not more than a sum of a voltage that is two times a dead-band voltage and the resetting voltage, the dead-band voltage being a maximum voltage at which a current does not flow when a voltage is applied to the memory cell in the forward direction from the anode to the cathode.

8. The semiconductor memory device according to claim 7, wherein prior to the setting operation of the selected memory cell, an intermediate voltage Vm1 is applied to the selected bit line and the selected word line, a voltage larger than the intermediate voltage Vm1 is applied to unselected word lines arranged in an identical wiring layer to the selected word line, and to a plurality of unselected bit lines and unselected word lines arranged more on a cathode side of the memory cell than the selected word line, and a voltage smaller than the intermediate voltage Vm1 is applied to unselected bit lines arranged in an identical wiring layer to the selected bit line, and to a plurality of unselected bit lines and unselected word lines arranged more on an anode side of the memory cell than the selected bit line.

9. The semiconductor memory device according to claim 7, wherein prior to the resetting operation of the selected memory cell, an intermediate voltage Vm2 is applied to the unselected bit lines and the unselected word lines, a voltage higher than the intermediate voltage Vm2 is applied to the selected word line, and a voltage lower than the intermediate voltage Vm2 is applied to the selected bit line.

10. A method of controlling a semiconductor memory device, the semiconductor memory device including: a memory cell array configured having a plurality of memory cell mats stacked therein, each of the memory cell mats including a plurality of first lines, a plurality of second lines intersecting the first lines, and a plurality of memory cells connected to the first lines and the second lines, and the memory cell mats being stacked such that the first lines and the second lines are shared alternately by each of the memory cell mats; and a peripheral circuit for applying a voltage to the memory cell array, wherein each of the memory cells has a variable resistance characteristic and a current rectifying characteristic, and adopts one end as an anode and the other end as a cathode according to the current rectifying characteristic, and wherein an orientation from the anode toward the cathode of all the memory cells in the memory cell array is identical, the method comprising:

during setting, resetting, and read operations of a selected memory cell, adopting one of the first line and the second line connected to an anode side of the selected memory cell as a selected bit line, and applying to the selected bit line a selected bit line voltage which is a voltage on the anode side required in the setting, resetting, and read operations; and adopting the other of the first line and the second line connected to a cathode side of the selected memory cell as a selected word line, and applying to the selected word line a selected word line voltage which is a voltage on the cathode side required in the setting, resetting, and read operations.

11. The method of controlling a semiconductor memory device according to claim 10, further comprising:

during the setting, resetting, and read operations of the selected memory cell, setting the first lines and the second lines connected to unselected memory cells of the memory cell array to a floating state.

12. The method of controlling a semiconductor memory device according to claim 10, wherein the setting operation is performed by applying a setting voltage to the selected memory cell in a forward direction from the anode to the cathode to set the memory cell to a low-resistance state, the resetting operation is performed by applying a resetting voltage to the selected memory cell in a reverse direction from the cathode to the anode to set the memory cell to a high-resistance state, and the setting voltage is not more than a sum of a voltage that is two times a dead-band voltage and the resetting voltage, the dead-band voltage being a maximum voltage at which a current does not flow when a voltage is applied to the memory cell in the forward direction from the anode to the cathode.

13. The method of controlling a semiconductor memory device according to claim 12, wherein prior to the setting operation of the selected memory cell, an intermediate voltage $V_{m1}$ is applied to the selected bit line and the selected word line, a voltage larger than the intermediate voltage $V_{m1}$ is applied to unselected word lines arranged in an identical wiring layer to the selected word line, and to a plurality of unselected bit lines and unselected word lines arranged more on a cathode side of the memory cell than the selected word line, and a voltage smaller than the intermediate voltage $V_{m1}$ is applied to unselected bit lines arranged in an identical wiring layer to the selected bit line, and to a plurality of unselected bit lines and unselected word lines arranged more on an anode side of the memory cell than the selected bit line.

14. The method of controlling a semiconductor memory device according to claim 12, wherein prior to the resetting operation of the selected memory cell, an intermediate voltage $V_{m2}$ is applied to the unselected bit lines and the unselected word lines, a voltage higher than the intermediate voltage $V_{m2}$ is applied to the selected word line, and a voltage lower than the intermediate voltage $V_{m2}$ is applied to the selected bit line.

15. A semiconductor memory device, comprising:

a memory cell array configured having a plurality of memory cell mats stacked therein, each of the memory cell mats including a plurality of first lines, a plurality of second lines intersecting the first lines, and a plurality of memory cells connected to the first lines and the second lines, and the memory cell mats being stacked such that the first lines and the second lines are shared alternately by each of the memory cell mats; and a peripheral circuit for applying a voltage to the memory cell array, the memory cell array having a substantially square underside, the first lines and the second lines being lead out from at least two adjacent side surfaces of the memory cell array, and the memory cell array being disposed in a matrix in a first direction in which the first lines extend and a second direction in which the second lines extend.

16. The semiconductor memory device according to claim 15, wherein the peripheral circuit comprises:

a bus formed along a periphery of an underside of the memory cell array; and a decode circuit disposed on an outer side of four corners of the underside of the memory cell array, the peripheral circuit has a 45° wiring region between a lead-out region from the bus and a lead-in region to the decode circuit, a bus of the lead-out region and a bus of the lead-in region are parallel, and an angle formed by a bus of the 45° wiring region and the buses of the lead-out region and the lead-in region is 45°, and an angle formed by a direction of alignment of each of wiring connection points of the bus of the lead-out region and the bus of the 45° wiring region and a direction of alignment of each of wiring connection points of the bus of the 45° wiring region and the bus of the lead-in region is 45°/2.

17. The semiconductor memory device according to claim 15, wherein the first lines and the second lines lead out from the adjacent two side surfaces of the memory cell array are each connected to the peripheral circuit via vertical wiring, and the peripheral circuit includes:

a first line control circuit connected to the first lines via the vertical wiring and configured to apply a voltage to the first lines;

a second line control circuit connected to the second lines via the vertical wiring and configured to apply a voltage to the second lines; and a control circuit adjacent to the first line control circuit and the second line control circuit.

18. The semiconductor memory device according to claim 17, wherein the first line control circuit and the second line control circuit each include:

a driver circuit disposed directly below the vertical wiring; and a sensing circuit disposed between the driver circuit and the control circuit.

19. The semiconductor memory device according to claim 17, wherein the first line control circuit and the second line control circuit are disposed underneath the memory cell array and are disposed symmetrically in four regions partitioned by two diagonal lines of a memory cell array underside.

20. The semiconductor memory device according to claim 17, wherein the first line control circuit and the second line control circuit are disposed underneath the memory cell array and are disposed symmetrically in two regions partitioned by one diagonal line of a memory cell array underside.

* * * * *